US012628300B2

(12) United States Patent (10) Patent No.: US 12,628,300 B2
Oonishi (45) Date of Patent: *May 12, 2026

(54) DIFFERENTIAL TRANSMISSION BOARD SET AND ASSEMBLY

(71) Applicant: Japan Aviation Electronics Industry, Ltd., Tokyo (JP)

(72) Inventor: Kenta Oonishi, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 347 days.

This patent is subject to a terminal disclaimer.

(21) Appl. No.: 18/307,946

(22) Filed: Apr. 27, 2023

(65) Prior Publication Data

US 2024/0079806 A1 Mar. 7, 2024

(30) Foreign Application Priority Data

Jun. 7, 2022 (JP) ................................. 2022-092179
Jun. 7, 2022 (JP) ................................. 2022-092180
Jun. 7, 2022 (JP) ................................. 2022-092181

(51) Int. Cl.
*H01R 12/70* (2011.01)
*H01R 12/55* (2011.01)
(Continued)

(52) U.S. Cl.
CPC ........... *H05K 7/1069* (2013.01); *H01R 12/55* (2013.01); *H01R 12/58* (2013.01);
(Continued)

(58) Field of Classification Search
CPC .. H05K 7/1069; H05K 1/0215; H05K 1/0228; H05K 1/0237; H05K 1/0298;
(Continued)

(56) References Cited

U.S. PATENT DOCUMENTS 7,056,128 B2 6/2006 Driscoll et al.
7,737,367 B2 6/2010 Koyama et al.
(Continued)

FOREIGN PATENT DOCUMENTS

JP 2017027721 A 2/2017
JP 6872054 B1 5/2021
(Continued)

OTHER PUBLICATIONS

Office Action issued on Jan. 14, 2025 in the counterpart KR Patent Application No. 2023-0054710, with English translation.
(Continued)

*Primary Examiner* — Truc T Nguyen
(74) *Attorney, Agent, or Firm* — Renner, Otto, Boisselle & Sklar, LLP

(57) ABSTRACT

A differential transmission board set includes a mounting board on which a compression connector is mounted and a contact board configured to come into contact with the compression connector. In the contact board, a second conductor layer is a ground layer and has a penetrating hole. The penetrating hole is formed in such a way that a first signal pad and a second signal pad are both located inside an inner edge of the penetrating hole. In the contact board, the penetrating hole is formed to overlap an outer region of the first ground pad and an outer region of the second ground pad.

7 Claims, 33 Drawing Sheets

(51) Int. Cl.

| | |
|---|---|
| *H01R 12/58* | (2011.01) |
| *H01R 12/71* | (2011.01) |
| *H01R 13/6469* | (2011.01) |
| *H01R 13/6471* | (2011.01) |
| *H05K 1/02* | (2006.01) |
| *H05K 1/05* | (2006.01) |
| *H05K 1/11* | (2006.01) |
| *H05K 1/14* | (2006.01) |
| *H05K 7/10* | (2006.01) |
| *H01R 12/73* | (2011.01) |
| *H01R 13/6461* | (2011.01) |
| *H05K 3/325* | (2026.01) |
| *H05K 3/36* | (2006.01) |
| *H05K 3/46* | (2006.01) |

(52) U.S. Cl.
CPC ....... *H01R 12/7011* (2013.01); *H01R 12/714* (2013.01); *H01R 13/6469* (2013.01); *H01R 13/6471* (2013.01); *H05K 1/0215* (2013.01); *H05K 1/0228* (2013.01); *H05K 1/0237* (2013.01); *H05K 1/0298* (2013.01); *H05K 1/05* (2013.01); *H05K 1/111* (2013.01); *H05K 1/115* (2013.01); *H05K 1/117* (2013.01); *H05K 1/144* (2013.01); *H01R 12/716* (2013.01); *H01R 12/73* (2013.01); *H01R 13/6461* (2013.01); *H05K 1/0245* (2013.01); *H05K 1/025* (2013.01); *H05K 1/0251* (2013.01); *H05K 1/11* (2013.01); *H05K 1/14* (2013.01); *H05K 3/325* (2013.01); *H05K 3/36* (2013.01); *H05K 3/368* (2013.01); *H05K 3/4644* (2013.01); *H05K 7/1053* (2013.01); *H05K 7/1061* (2013.01); *H05K 2201/0311* (2013.01); *H05K 2201/094* (2013.01); *H05K 2201/09445* (2013.01); *H05K 2201/10378* (2013.01)

(58) Field of Classification Search
CPC .......... H05K 1/05; H05K 1/111; H05K 1/115; H05K 1/117; H05K 1/144; H05K 1/0245; H05K 1/025; H05K 1/0251; H05K 1/11; H05K 1/14; H05K 3/325; H05K 3/36; H05K 3/368; H05K 3/4644; H05K 7/1053; H05K 7/1061; H05K 2201/0311; H05K 2201/094; H05K 2201/09445; H05K 2201/10378; H01R 12/55; H01R 12/58; H01R 12/7011; H01R 12/714; H01R 13/6469; H01R 13/6471; H01R 12/716; H01R 12/73; H01R 13/6461
See application file for complete search history.

(56) References Cited

U.S. PATENT DOCUMENTS

| | | | | |
|---|---|---|---|---|
| 2007/0218710 | A1* | 9/2007 | Brown ................. | H05K 3/4092 439/66 |
| 2009/0120668 | A1* | 5/2009 | Fjelstad ............. | H01R 12/7082 174/250 |
| 2011/0287671 | A1* | 11/2011 | Ihara ................... | H01R 13/2435 439/709 |
| 2017/0303395 | A1 | 10/2017 | Ishida et al. | |
| 2021/0305734 | A1* | 9/2021 | Oosaka ............... | H01R 12/523 |
| 2021/0384658 | A1 | 12/2021 | Oosaka et al. | |
| 2022/0181775 | A1 | 6/2022 | Ryu et al. | |
| 2023/0007775 | A1* | 1/2023 | Li ........................... | H05K 1/116 |
| 2023/0208058 | A1* | 6/2023 | Morgan ............... | H01R 12/716 439/65 |
| 2023/0402775 | A1 | 12/2023 | Shimoyama et al. | |
| 2023/0411906 | A1* | 12/2023 | Morgan ............. | H01R 13/2435 |
| 2024/0063562 | A1* | 2/2024 | Maynard ............. | H05K 3/3436 |

FOREIGN PATENT DOCUMENTS

| | | |
|---|---|---|
| JP | 2021157993 A | 10/2021 |
| KR | 20170048575 A | 5/2017 |
| KR | 20210099165 A | 8/2021 |

OTHER PUBLICATIONS

Office Action issued on Jan. 14, 2025 in the counterpart KR Patent Application No. 2023-0054711, with English translation.
Office Action issued on Jan. 16, 2025 in the counterpart KR Patent Application No. 2023-0054712, with English translation.
Office Action mailed May 19, 2025 in corresponding U.S. Appl. No. 18/307,953.
Office Action mailed Oct. 17, 2025 in corresponding U.S. Appl. No. 18/307,953.
Office Action mailed Sep. 25, 2025 in corresponding U.S. Appl. No. 18/307,957.
Notice of Allowance mailed Jan. 23, 2026 in corresponding U.S. Appl. No. 18/307,953.
Notice of Allowance received for U.S. Appl. No. 18/307,957, mailed on Mar. 6, 2026, 9 pages.

* cited by examiner

VERTICAL DIRECTION

WIDTH DIRECTION

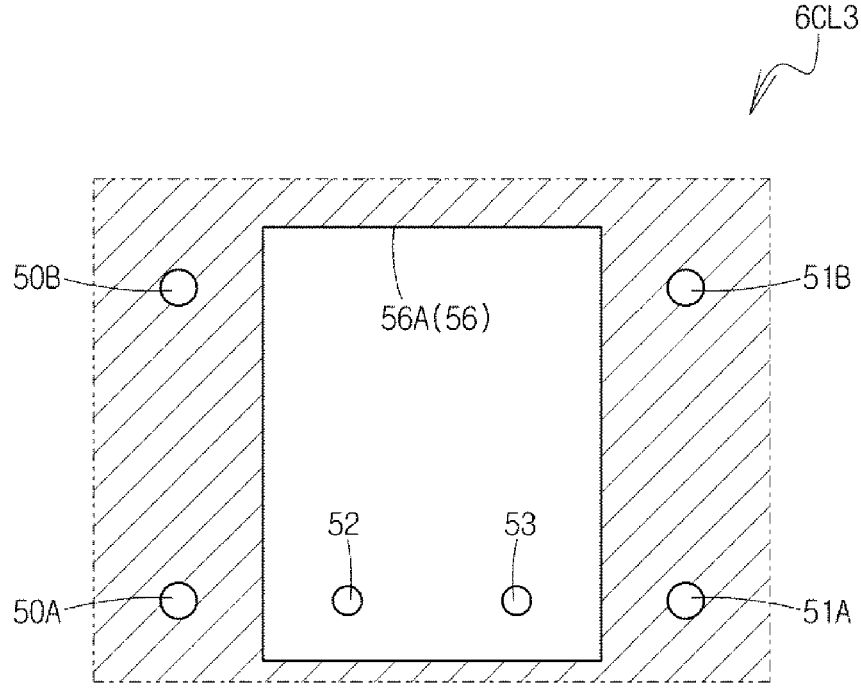
6CL3
50B
56A(56)
51B
50A
52        53
51A
Fig. 6        WIDTH DIRECTION    PITCH DIRECTION

WIDTH DIRECTION

PITCH DIRECTION

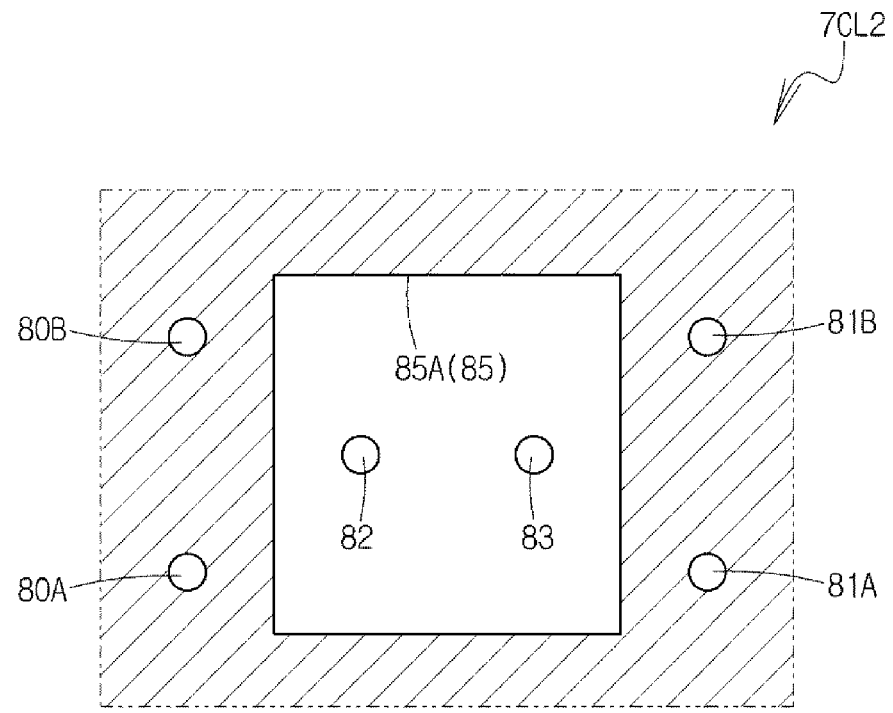
Fig. 12

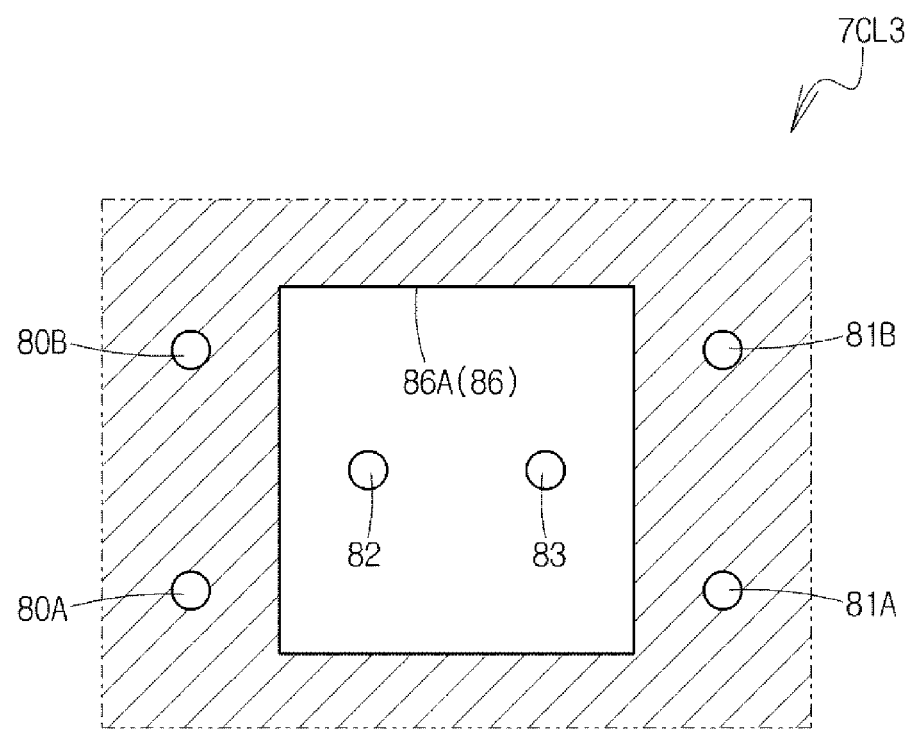
7CL3
80B
86A(86)
81B
82
83
80A
81A
Fig. 13
WIDTH DIRECTION
PITCH DIRECTION

WIDTH DIRECTION

PITCH DIRECTION

6CL2,6CL3,6CL4

WIDTH DIRECTION

PITCH DIRECTION

DIFFERENTIAL TRANSMISSION BOARD SET AND ASSEMBLY

INCORPORATION BY REFERENCE

This application is based upon and claims the benefit of priority from Japanese patent application No. 2022-92179, filed on Jun. 7, 2022, Japanese patent application No. 2022-92180, filed on Jun. 7, 2022, Japanese patent application No. 2022-92181, filed on Jun. 7, 2022, the disclosure of which are incorporated herein in its entirety by reference.

BACKGROUND

The present invention relates to a differential transmission board set and an assembly.

As shown in FIG. 36 of the present application, Patent Literature 1 (Japanese Unexamined Patent Application Publication No. 2017-27721) discloses a paddle card board 1002, which is a multilayer board in which a plurality of conductor layers 1000 and a plurality of insulator layers 1001 are laminated alternately. The plurality of conductor layers 1000 include a first conductor layer 1000A, a second conductor layer 1000B, a third conductor layer 1000C, and a fourth conductor layer 1000D. The plurality of insulator layers 1001 include a first insulator layer 1001A, a second insulator layer 1001B, and a third insulator layer 1001C. The first conductor layer 1000A, the first insulator layer 1001A, the second conductor layer 1000B, the second insulator layer 1001B, the third conductor layer 1000C, the third insulator layer 1001C, and the fourth conductor layer 1000D are sequentially arranged in this order from the surface layer side to the inner layer side of the paddle card board 1002.

The first conductor layer 1000A includes two cable connection pads 1003 to which two signal line conductors of differential signal transmission cables are soldered, and two ground pads 1004 disposed with the two cable connection pads 1003 interposed therebetween.

The second conductor layer 1000B and the third conductor layer 1000C respectively have a penetrating hole 1005B and a penetrating hole 1005C that overlap the two cable connection pads 1003 in the laminating direction, and this reduces capacitive coupling between the two cable connection pads 1003 and the second conductor layer 1000B, and thereby controls a decrease in differential impedance in the two cable connection pads 1003.

SUMMARY

The inventors of the present application are developing two differential transmission boards that are electrically connected to each other through a compression connector including a plurality of compression contacts, each having a soldering part and a spring part, and a housing that holds the plurality of compression contacts. The two differential transmission boards are combined into a differential transmission board set.

One of the objects of the present disclosure is to provide a technique to improve the transmission characteristics of the differential transmission board set.

According to an aspect of the present disclosure, there is provided a differential transmission board set being a combination of two differential transmission boards electrically connected to each other through a compression connector including four compression contacts arranged in a row, each compression contact including a soldering part and a spring part, and a housing holding the four compression contacts, wherein the two differential transmission boards include a mounting board on which the compression connector is mounted and a contact board configured to come into contact with the compression connector, each of the mounting board and the contact board is a multilayer board having a plurality of conductor layers and a plurality of insulator layers laminated alternately, in each of the mounting board and the contact board, the plurality of conductor layers include a first conductor layer and a second conductor layer sequentially in this recited order from the compression connector side, in each of the mounting board and the contact board, the first conductor layer includes four electrode pads corresponding to the four compression contacts, the four electrode pads include a first signal pad, a second signal pad, a first ground pad, and a second ground pad, the first ground pad, the first signal pad, the second signal pad, and the second ground pad are arranged in this recited order along a first direction, in the mounting board, the soldering parts of the four compression contacts are able to be soldered to the first ground pad, the first signal pad, the second signal pad, and the second ground pad, respectively, in the contact board, the spring parts of the four compression contacts are able to come into contact with the first ground pad, the first signal pad, the second signal pad, and the second ground pad, respectively, in each of the mounting board and the contact board, the second conductor layer is a ground layer and has a penetrating hole, in each of the mounting board and the contact board, the penetrating hole is formed in such a way that the first signal pad and the second signal pad are both located inside an inner edge of the penetrating hole when viewed in a laminating direction, in each of the mounting board and the contact board, the first ground pad includes an inner region closer to the first signal pad relative to a dividing line that divides a pad area of the first ground pad in half in the first direction, and an outer region farther from the first signal pad relative to the dividing line, in each of the mounting board and the contact board, the second ground pad includes an inner region closer to the second signal pad relative to a dividing line that divides a pad area of the second ground pad in half in the first direction, and an outer region farther from the second signal pad relative to the dividing line, and in at least one of the mounting board and the contact board, the penetrating hole is formed to overlap the outer region of the first ground pad and the outer region of the second ground pad when viewed along the laminating direction.

According to the present disclosure, the transmission characteristics of the differential transmission board set are improved.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 6 is a partial bottom view of a third conductor layer of the contact board (first embodiment);

FIG. 12 is a partial plan view of a second conductor layer of the mounting board (first embodiment);

FIG. 13 is a partial plan view of a third conductor layer of the mounting board (first embodiment);

DESCRIPTION OF EMBODIMENTS

First Embodiment

A first embodiment is described hereinafter with reference to FIGS. 1 to 17.

Figure 1:
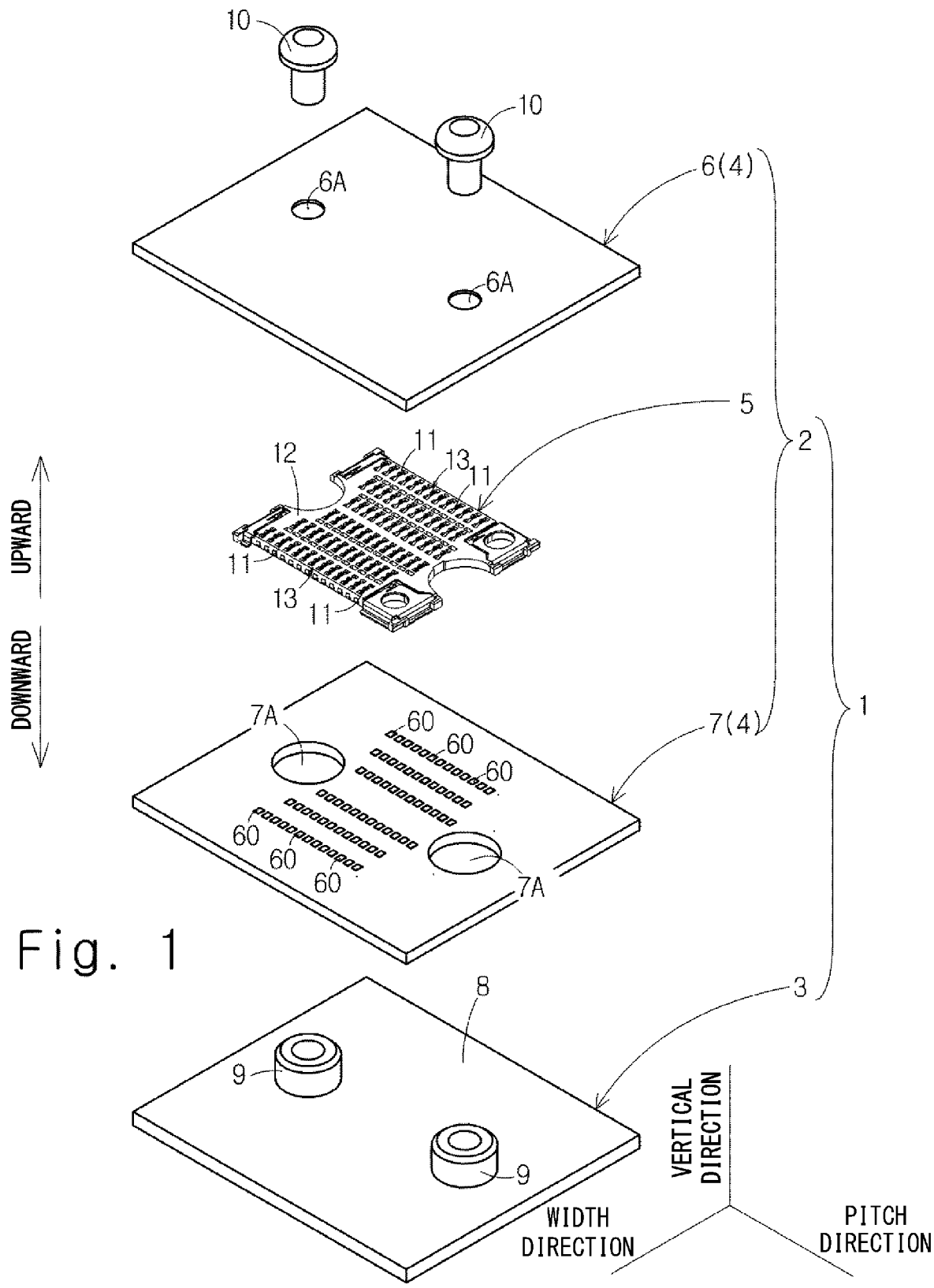
FIG. 1 is an exploded perspective view of an information processing device (first embodiment)
Figure 2:
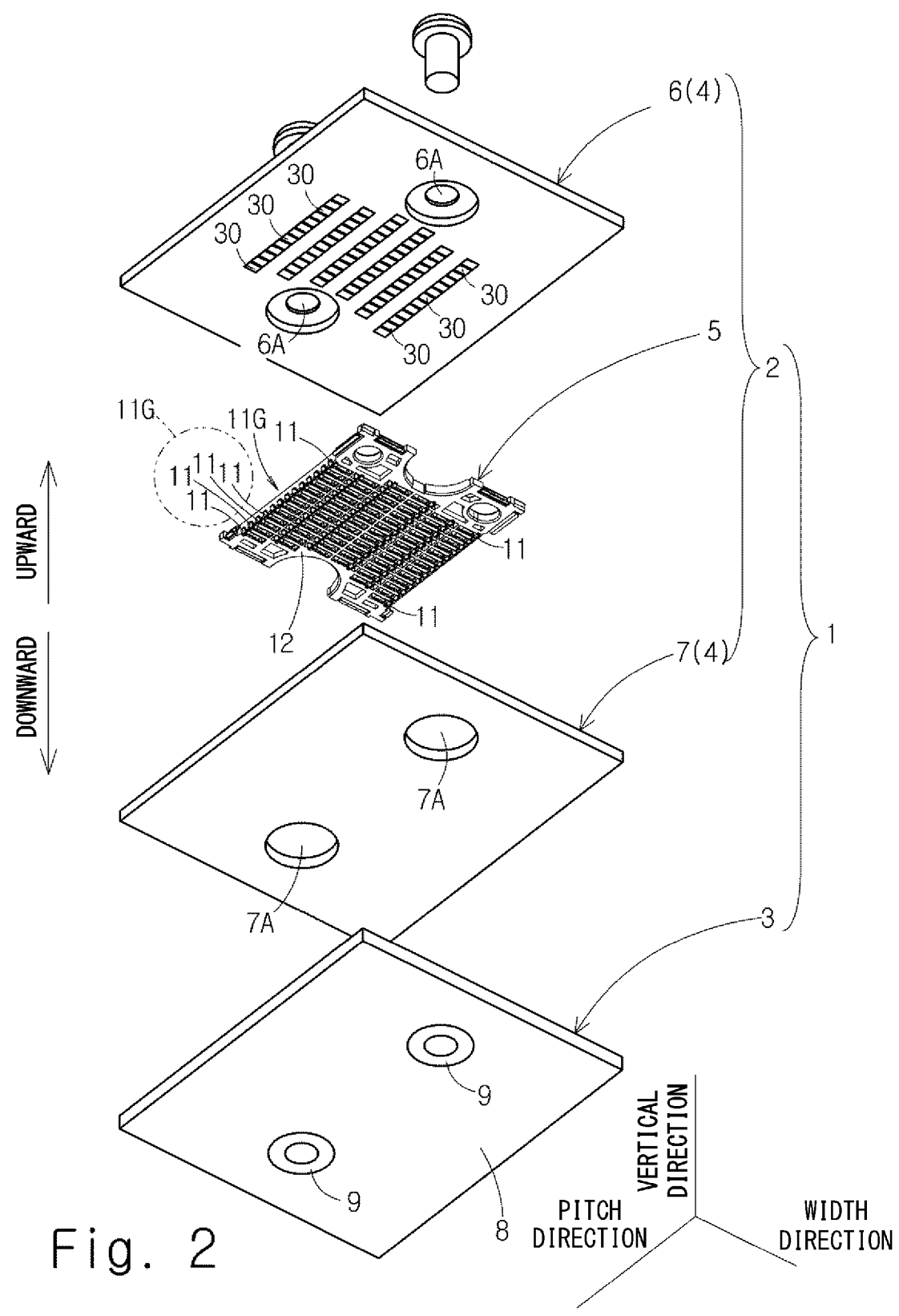
FIG. 2 is an exploded perspective view of the information processing device when viewed from another angle (first embodiment)

FIGS. 1 and 2 are exploded perspective view of an information processing device 1. As shown in FIGS. 1 and 2, the information processing device 1 includes a differential transmission assembly 2 (assembly) and a support board 3.

The differential transmission assembly 2 includes a differential transmission board set 4 and a compression connector 5.

The differential transmission board set 4 includes a contact board 6 and a mounting board 7. The contact board 6 and the mounting board 7 are electrically connected to each other through the compression connector 5. The contact board 6 and the mounting board 7 are both differential transmission boards. The contact board 6 and the mounting board 7 are parallel to each other in the state of being electrically connected to each other through the compression connector 5.

The contact board 6 has two bolt fastening holes 6A. Likewise, the mounting board 7 has two bolt fastening holes 7A.

The support board 3 is typically a part of a housing that accommodates the contact board 6, the compression connector 5, and the mounting board 7, and it is made of aluminum or an aluminum alloy, for example. The support board 3 includes a flat-plate board main body 8 and two nuts 9 projecting from the board main body 8.

The information processing device 1 is assembled as follows. First, the compression connector 5 is mounted on the mounting board 7. Next, the mounting board 7 on which the compression connector 5 is mounted is attached to the support board 3. At this time, the two nuts 9 of the support board 3 penetrate through the two bolt fastening holes 7A of the mounting board 7.

Then, the contact board 6 is attached to the support board 3 in such a way that the contact board 6 overlaps the compression connector 5. To be specific, two bolts 10 are respectively fastened to the two nuts 9 of the support board 3 through the two bolt fastening holes 6A of the contact board 6. The contact board 6 is thereby pressed against the compression connector 5 and comes into contact with the compression connector 5, and consequently the contact board 6 and the mounting board 7 are electrically connected to each other through the compression connector 5. Specifically, the compression connector 5 is not mounted on the contact board 6, and the compression connector 5 and the contact board 6 come into contact with each other only when the contact board 6 is pressed against the compression connector 5.

Referring still to FIGS. 1 and 2, the compression connector 5 includes a plurality of compression contacts 11 and a housing 12 that holds the plurality of compression contacts 11. The plurality of compression contacts 11 form a plurality of contact rows 13. The plurality of contact rows 13 extend parallel to one another.

A pitch direction, a width direction, and a vertical direction are defined as below. The pitch direction, the width direction, and the vertical direction are orthogonal to each other. The pitch direction is the row direction of each contact row 13. The width direction is the direction in which the plurality of contact rows 13 extending parallel to one another are arranged. The vertical direction is the direction in which the contact board 6 and the compression connector 5, and the compression connector 5 and the mounting board 7 are respectively opposed to each other. Thus, the thickness direction of the contact board 6 and the thickness direction of the mounting board 7 correspond to the vertical direction. The direction of viewing the contact board 6 from the compression connector 5 is referred to as upward, and the direction of viewing the mounting board 7 from the compression connector 5 is referred to as downward. The vertical direction is the direction used by way of illustration only and should not be interpreted as limiting the position of the information processing device 1 when actually used.

Figure 3:
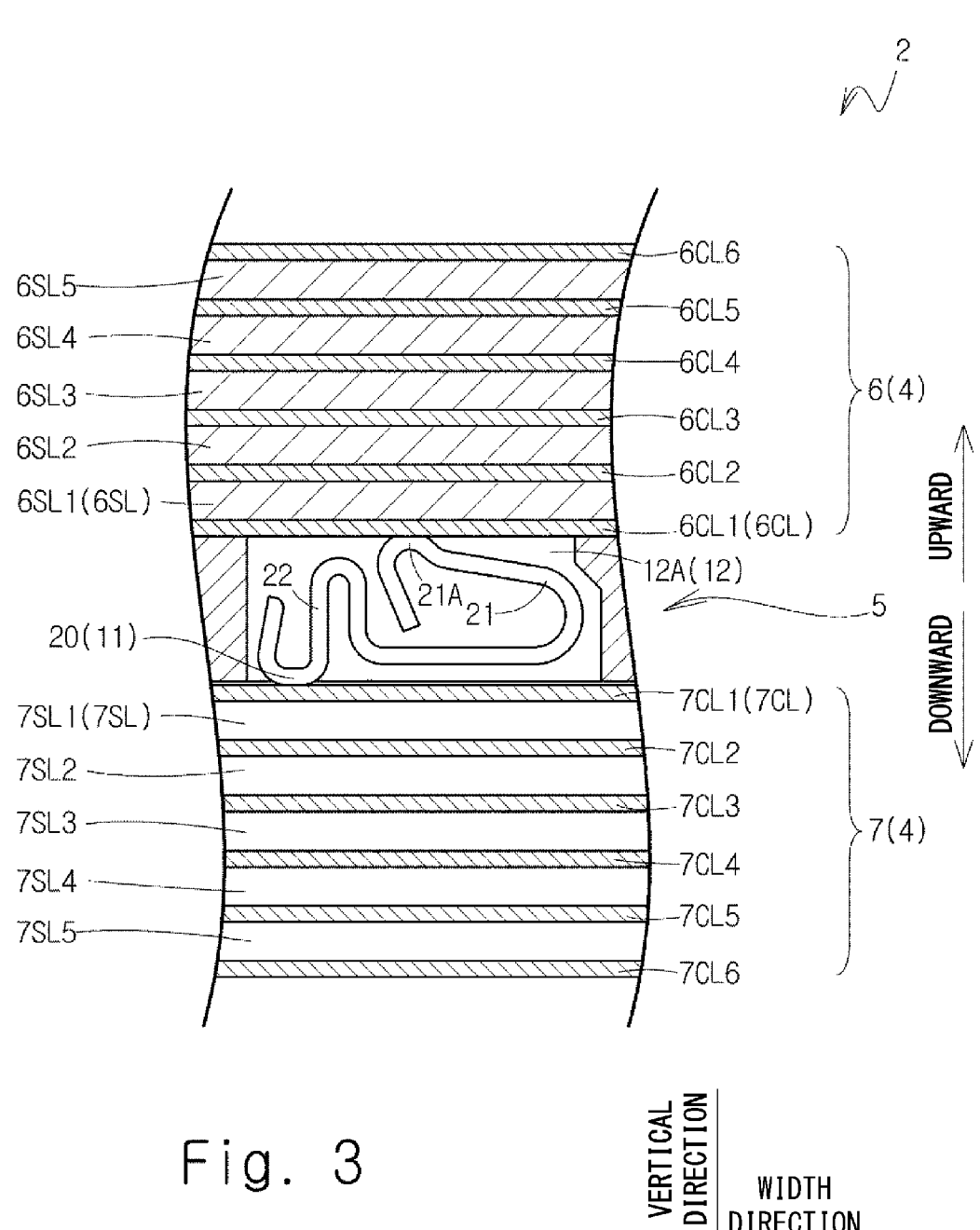
FIG. 3 is a cross-sectional view of a differential transmission assembly (first embodiment)

FIG. 3 is a cross-sectional view of the differential transmission assembly 2. As shown in FIG. 3, each compression contact 11 is accommodated by press fitting into a contact accommodation room 12A of the housing 12. Each compression contact 11 includes a soldering part 20, a spring part 21, and a press-fit part 22. The spring part 21 has a contact point part 21A that is elastically displaceable in the vertical direction. The spring part 21 is supported like a cantilever beam by the press-fit part 22, and thereby the contact point part 21A is elastically displaceable in the vertical direction.

The contact board 6 is a multilayer board in which a plurality of conductor layers 6CL and a plurality of insulator layers 6SL are laminated alternately. The plurality of conductor layers 6CL include a first conductor layer 6CL1, a second conductor layer 6CL2, a third conductor layer 6CL3, a fourth conductor layer 6CL4, a fifth conductor layer 6CL5, and a sixth conductor layer 6CL6 sequentially from the compression connector 5 side to the upside. The plurality of insulator layers 6SL include a first insulator layer 6SL1, a second insulator layer 6SL2, a third insulator layer 6SL3, a fourth insulator layer 6SL4, and a fifth insulator layer 6SL5 sequentially from the compression connector 5 side to the upside. Thus, the first conductor layer 6CL1, the first insulator layer 6SL1, the second conductor layer 6CL2, the second insulator layer 6SL2, the third conductor layer 6CL3, the third insulator layer 6SL3, the fourth conductor layer 6CL4, the fourth insulator layer 6SL4, the fifth conductor layer 6CL5, the fifth insulator layer 6SL5, and the sixth conductor layer 6CL6 are sequentially laminated from the compression connector 5 side to the upside. The laminating direction of the contact board 6 corresponds to the vertical direction. The second conductor layer 6CL2 is a conductor layer that is closest to the first conductor layer 6CL1.

Each conductor layer 6CL is typically made of copper foil with high electrical conductivity. Each insulator layer 6SL is typically made of glass epoxy.

Likewise, the mounting board 7 is a multilayer board in which a plurality of conductor layers 7CL and a plurality of insulator layers 7SL are laminated alternately. The plurality of conductor layers 7CL include a first conductor layer 7CL1, a second conductor layer 7CL2, a third conductor layer 7CL3, a fourth conductor layer 7CL4, a fifth conductor layer 7CL5, and a sixth conductor layer 7CL6 sequentially from the compression connector 5 side to the downside. The plurality of insulator layers 7SL include a first insulator layer 7SL1, a second insulator layer 7SL2, a third insulator layer 7SL3, a fourth insulator layer 7SL4, and a fifth insulator layer 7SL5 sequentially from the compression connector 5 side to the downside. Thus, the first conductor layer 7CL1, the first insulator layer 7SL1, the second conductor layer 7CL2, the second insulator layer 7SL2, the third conductor layer 7CL3, the third insulator layer 7SL3, the fourth conductor layer 7CL4, the fourth insulator layer 7SL4, the fifth conductor layer 7CL5, the fifth insulator layer 7SL5, and the sixth conductor layer 7CL6 are sequentially laminated from the compression connector 5 side to the downside. The laminating direction of the mounting board 7 corresponds to the vertical direction. The second conductor layer 7CL2 is a conductor layer that is closest to the first conductor layer 7CL1.

Each conductor layer 7CL is typically made of copper foil with high electrical conductivity. Each insulator layer 7SL is typically made of glass epoxy.

<Contact Board 6>

FIGS. 4 to 9 are partial bottom views of the first conductor layer 6CL1, the second conductor layer 6CL2, the third conductor layer 6CL3, the fourth conductor layer 6CL4, the fifth conductor layer 6CL5, and the sixth conductor layer 6CL6 of the contact board 6. In FIGS. 4 to 9, a conductor part is indicated by hatching for the sake of visibility.

Figure 4:
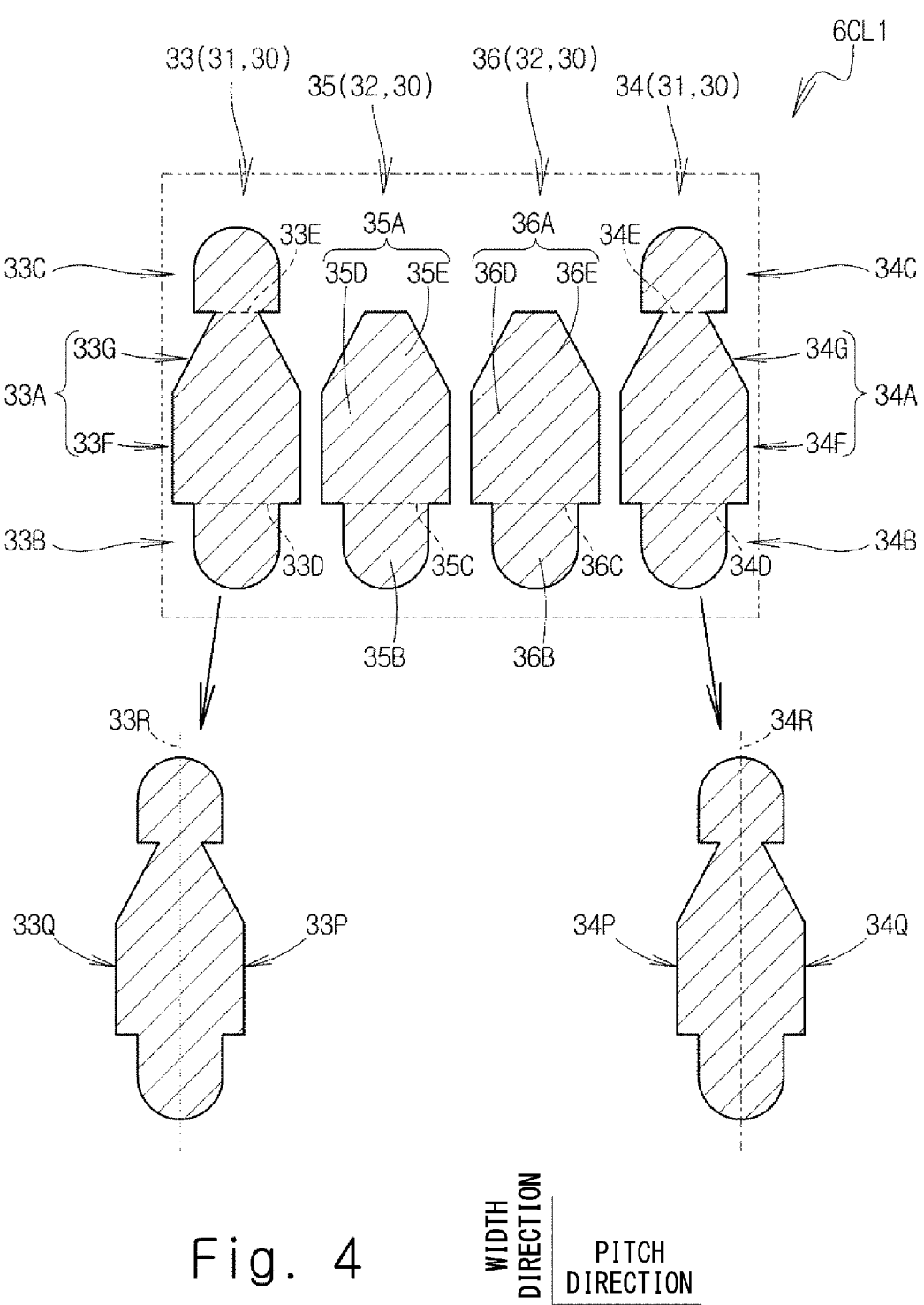
FIG. 4 is a partial bottom view of a first conductor layer of a contact board (first embodiment)

First, the first conductor layer 6CL1 is described hereinafter with reference to FIGS. 2 and 4. As shown in FIGS. 2 and 4, the first conductor layer 6CL1 includes a plurality of electrode pads 30 respectively corresponding to the plurality of compression contacts 11 of the compression connector 5. Specifically, the spring part 21 of the corresponding compression contact 11 is able to come into contact with each electrode pad 30. The plurality of electrode pads 30 form a plurality of pad rows, just like the plurality of compression contacts 11.

As shown in FIG. 4, in the plurality of electrode pads 30 belonging to each pad row, two ground pads 31 and two signal pads 32 are arranged alternately in the pitch direction. Specifically, the ground pad 31, the ground pad 31, the signal pad 32, the signal pad 32, the ground pad 31, the ground pad 31, the signal pad 32, the signal pad 32 and so on are arranged sequentially in this recited order along the pitch direction. In other words, the two signal pads 32 for differential transmission are disposed between the two ground pads 31. FIG. 4 shows only four electrode pads 30. The four electrode pads 30 shown in FIG. 4 include two ground pads 31 and two signal pads 32 disposed between the two ground pads 31. The two ground pads 31 include a first ground pad 33 and a second ground pad 34. The two signal pads 32 include a first signal pad 35 and a second signal pad 36. The first ground pad 33, the first signal pad 35, the second signal pad 36, and the second ground pad 34 are arranged in this recited order along the pitch direction.

The first signal pad 35 includes a spring contact part 35A and a via connection part 35B. The spring contact part 35A and the via connection part 35B are connected to each other in the width direction and thereby formed integrally. For the purpose of illustration, a boundary 35C between the spring contact part 35A and the via connection part 35B is indicated by a dashed line. The spring contact part 35A includes a base part 35D that is substantially square and a tapered part 35E that extends in a tapered shape from the base part 35D in the width direction.

Likewise, the second signal pad 36 includes a spring contact part 36A and a via connection part 36B. The spring contact part 36A and the via connection part 36B are connected to each other in the width direction and thereby formed integrally. For the purpose of illustration, a boundary 36C between the spring contact part 36A and the via connection part 36B is indicated by a dashed line. The spring contact part 36A includes a base part 36D that is substantially square and a tapered part 36E that extends in a tapered shape from the base part 36D in the width direction.

The first ground pad 33 includes a spring contact part 33A, a first via connection part 33B, and a second via connection part 33C. The first via connection part 33B, the spring contact part 33A, and the second via connection part 33C are disposed in this recited order in the width direction. The spring contact part 33A, the first via connection part 33B, and the second via connection part 33C are formed integrally. For the purpose of illustration, a boundary 33D between the spring contact part 33A and the first via connection part 33B is indicated by a dashed line. Likewise, a boundary 33E between the spring contact part 33A and the second via connection part 33C is indicated by a dashed line. The spring contact part 33A includes a base part 33F that is substantially square and a tapered part 33G that extends in a tapered shape from the base part 33F in the width direction.

Likewise, the second ground pad 34 includes a spring contact part 34A, a first via connection part 34B, and a second via connection part 34C. The first via connection part 34B, the spring contact part 34A, and the second via connection part 34C are disposed in this recited order in the width direction. The spring contact part 34A, the first via connection part 34B, and the second via connection part 34C are formed integrally. For the purpose of illustration, a boundary 34D between the spring contact part 34A and the first via connection part 34B is indicated by a dashed line. Likewise, a boundary 34E between the spring contact part 34A and the second via connection part 34C is indicated by a dashed line. The spring contact part 34A includes a base part 34F that is substantially square and a tapered part 34G that extends in a tapered shape from the base part 34F in the width direction.

As shown in FIG. 4, the first signal pad 35 and the second signal pad 36 have the same shape, and the first ground pad 33 and the second ground pad 34 have the same shape. The spring contact part 35A of the first signal pad 35, the spring contact part 36A of the second signal pad 36, the spring contact part 33A of the first ground pad 33, and the spring contact part 34A of the second ground pad 34 have the same shape, and are aligned in the pitch direction. The via connection part 35B of the first signal pad 35, the via connection part 36B of the second signal pad 36, the first via connection part 33B of the first ground pad 33, and the first via connection part 34B of the second ground pad 34 have the same shape, and are aligned in the pitch direction.

Referring still to FIG. 4, the first ground pad 33 has an inner region 33P and an outer region 33Q. The inner region 33P is a region closer to the first signal pad 35 relative to a dividing line 33R that divides the pad area of the first ground pad 33 in half in the pitch direction. The outer region 33Q is a region farther from the first signal pad 35 relative to the dividing line 33R. The first ground pad 33 has a symmetrical shape with respect to the dividing line 33R in the pitch direction. The dividing line 33R is a straight line that extends along the width direction and divides the pad area of the first ground pad 33 into two equal parts in the pitch direction. An area of the inner region 33P equals to an area of the outer region 33Q.

Likewise, the second ground pad 34 has an inner region 34P and an outer region 34Q. The inner region 34P is a region closer to the second signal pad 36 relative to a dividing line 34R that divides the pad area of the second ground pad 34 in half in the pitch direction. The outer region 34Q is a region farther from the second signal pad 36 relative to the dividing line 34R. The second ground pad 34 has a symmetrical shape with respect to the dividing line 34R in the pitch direction. The dividing line 34R is a straight line that extends along the width direction and divides the pad area of the second ground pad 34 into two equal parts in the pitch direction. An area of the inner region 34P equals to an area of the outer region 34Q.

Figure 9:
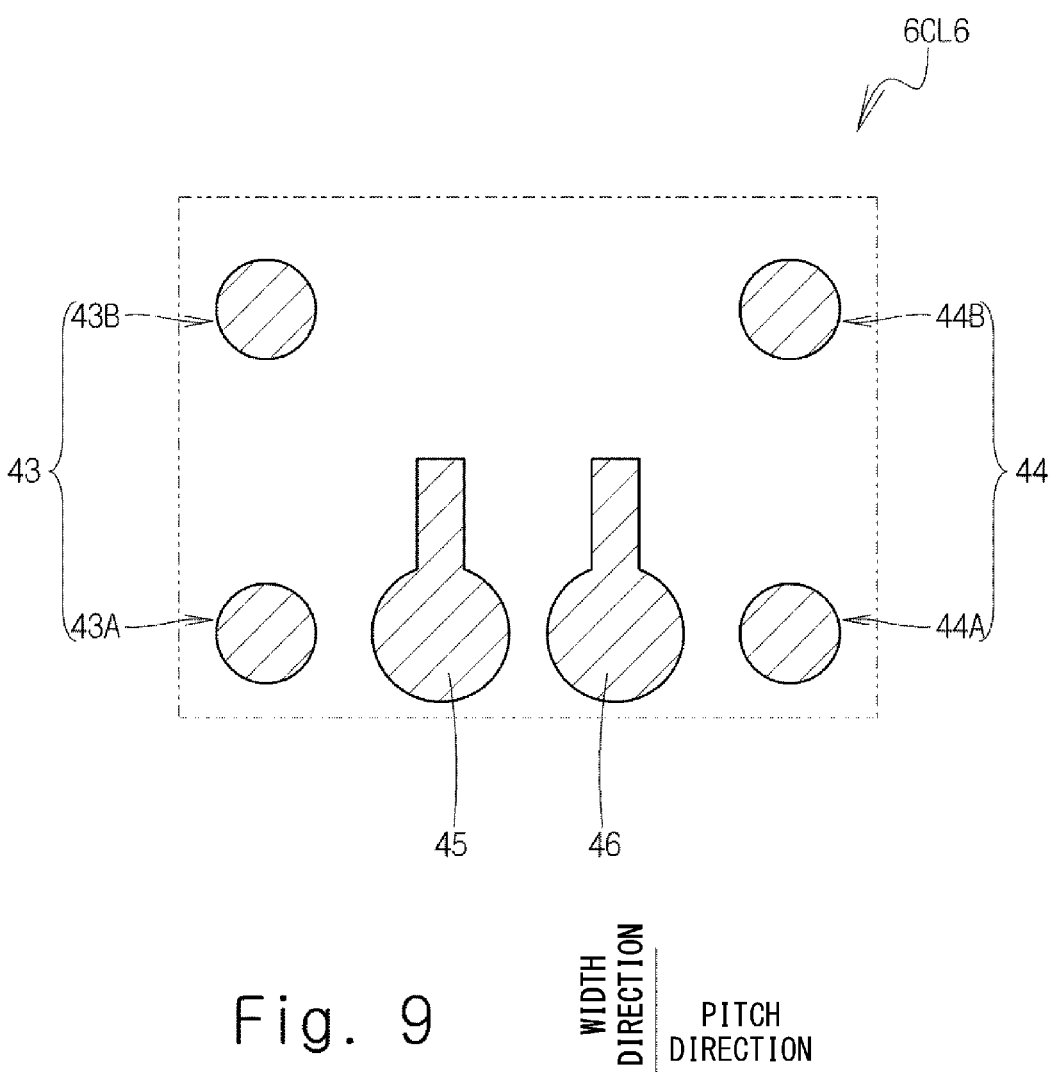
FIG. 9 is a partial bottom view of a sixth conductor layer of the contact board (first embodiment)

Referring next to FIG. 9, the sixth conductor layer 6CL6 is described hereinafter. As shown in FIG. 9, the sixth conductor layer 6CL6 includes a first ground pad 43, a second ground pad 44, a first signal pad 45, and a second signal pad 46 respectively corresponding to the first ground pad 33, the second ground pad 34, the first signal pad 35, and the second signal pad 36 shown in FIG. 4.

The first ground pad 43 includes a first via connection part 43A and a second via connection part 43B. Although the first via connection part 43A and the second via connection part 43B are separated from each other in the width direction, they may be formed integrally.

The second ground pad 44 includes a first via connection part 44A and a second via connection part 44B. Although the first via connection part 44A and the second via connection part 44B are separated from each other in the width direction, they may be formed integrally.

Figure 5:
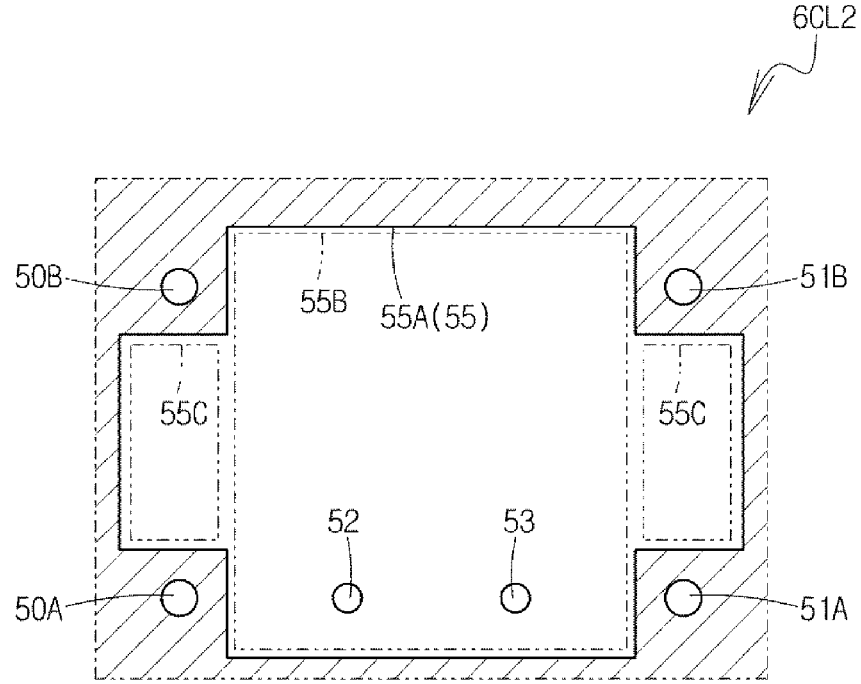
FIG. 5 is a partial bottom view of a second conductor layer of the contact board (first embodiment)

The first via connection part 43A of the first ground pad 43 is electrically connected to the first via connection part 33B of the first ground pad 33 shown in FIG. 4 through a via hole 50A shown in FIG. 5 and the like. Likewise, the second via connection part 43B of the first ground pad 43 is electrically connected to the second via connection part 33C of the first ground pad 33 shown in FIG. 4 through a via hole 50B shown in FIG. 5 and the like.

The first via connection part 44A of the second ground pad 44 is electrically connected to the first via connection part 34B of the second ground pad 34 shown in FIG. 4 through a via hole 51A shown in FIG. 5 and the like. Likewise, the second via connection part 44B of the second ground pad 44 is electrically connected to the second via connection part 34C of the second ground pad 34 shown in FIG. 4 through a via hole 51B shown in FIG. 5 and the like.

The first signal pad 45 is electrically connected to the via connection part 35B of the first signal pad 35 shown in FIG. 4 through a via hole 52 shown in FIG. 5 and the like.

The second signal pad 46 is electrically connected to the via connection part 36B of the second signal pad 36 shown in FIG. 4 through a via hole 53 shown in FIG. 5 and the like.

The second conductor layer 6CL2 to the fifth conductor layer 6CL5 are described hereinafter with reference to FIGS. 5 to 8. The second conductor layer 6CL2 to the fifth conductor layer 6CL5 are continuous with one another through the via hole 50A, the via hole 50B, the via hole 51A and the via hole 51B, and each of them functions as a ground layer.

As shown in FIG. 5, the second conductor layer 6CL2 has a penetrating hole 55. The penetrating hole 55 has an inner edge 55A. In FIG. 5, the via hole 52 and the via hole 53 are disposed inside the inner edge 55A of the penetrating hole 55. The via hole 50A, the via hole 50B, the via hole 51A and the via hole 51B are disposed outside the inner edge 55A of the penetrating hole 55. The penetrating hole 55 includes a rectangular part 55B that is substantially rectangular and two extension parts 55C that extend from the rectangular part 55B in the pitch direction. One of the two extension parts 55C extends to run between the via hole 50A and the via hole 50B, and the other one extends to run between the via hole 51A and the via hole 51B.

As shown in FIG. 6, the third conductor layer 6CL3 has a penetrating hole 56. The penetrating hole 56 has an inner edge 56A. In FIG. 6, the via hole 52 and the via hole 53 are disposed inside the inner edge 56A of the penetrating hole 56. The via hole 50A, the via hole 50B, the via hole 51A and the via hole 51B are disposed outside the inner edge 56A of the penetrating hole 56. The penetrating hole 56 is substantially rectangular.

Figure 7:
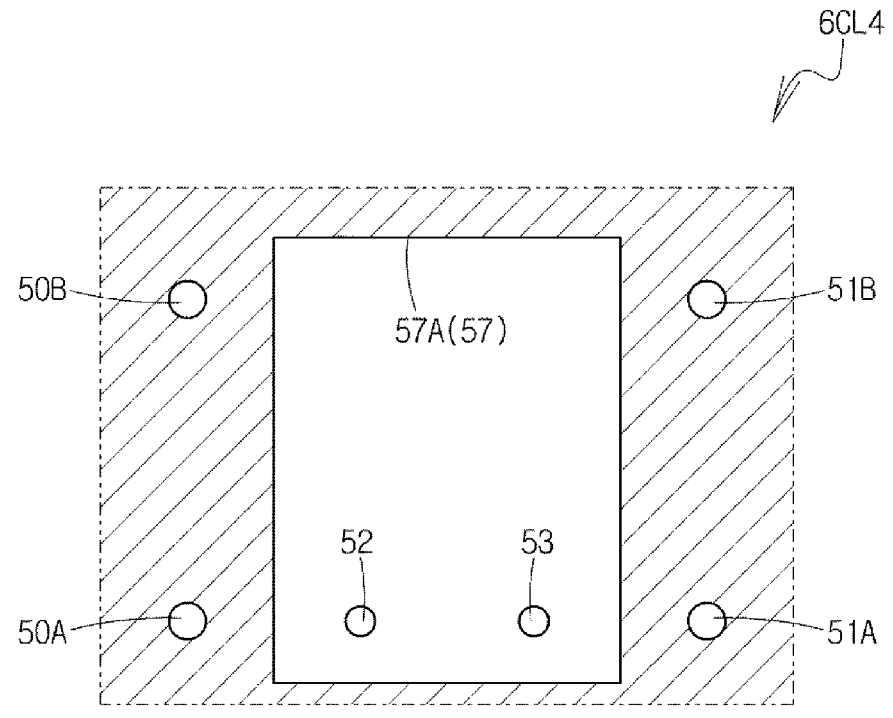
FIG. 7 is a partial bottom view of a fourth conductor layer of the contact board (first embodiment)

As shown in FIG. 7, the fourth conductor layer 6CL4 has a penetrating hole 57. The penetrating hole 57 has an inner edge 57A. In FIG. 7, the via hole 52 and the via hole 53 are disposed inside the inner edge 57A of the penetrating hole 57. The via hole 50A, the via hole 50B, the via hole 51A and the via hole 51B are disposed outside the inner edge 57A of the penetrating hole 57. The penetrating hole 57 is substantially rectangular.

Figure 8:
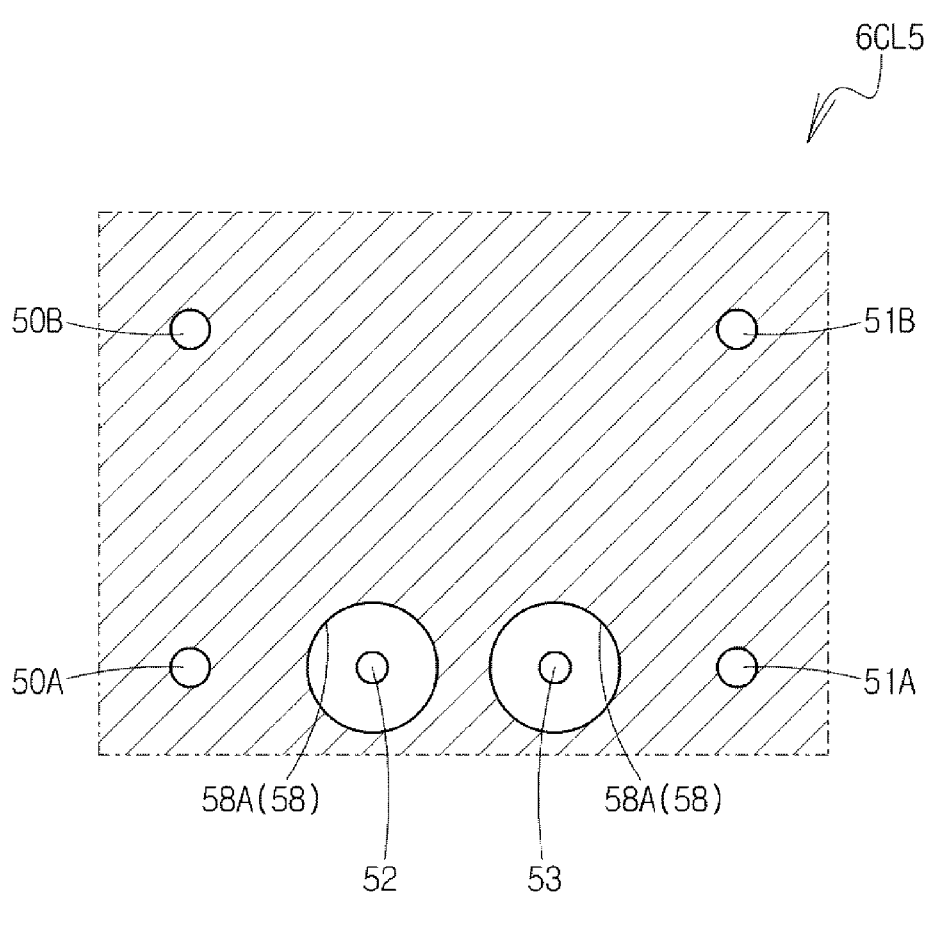
FIG. 8 is a partial bottom view of a fifth conductor layer of the contact board (first embodiment)

As shown in FIG. 8, the fifth conductor layer 6CL5 has two penetrating holes 58. Each penetrating hole 58 has an inner edge 58A. In FIG. 8, the via hole 52 and the via hole 53 are respectively disposed inside the inner edges 58A of the two penetrating holes 58. The via hole 50A, the via hole 50B, the via hole 51A and the via hole 51B are disposed outside the inner edges 58A of the two penetrating holes 58. Each penetrating hole 58 is substantially circular.

Figure 10:
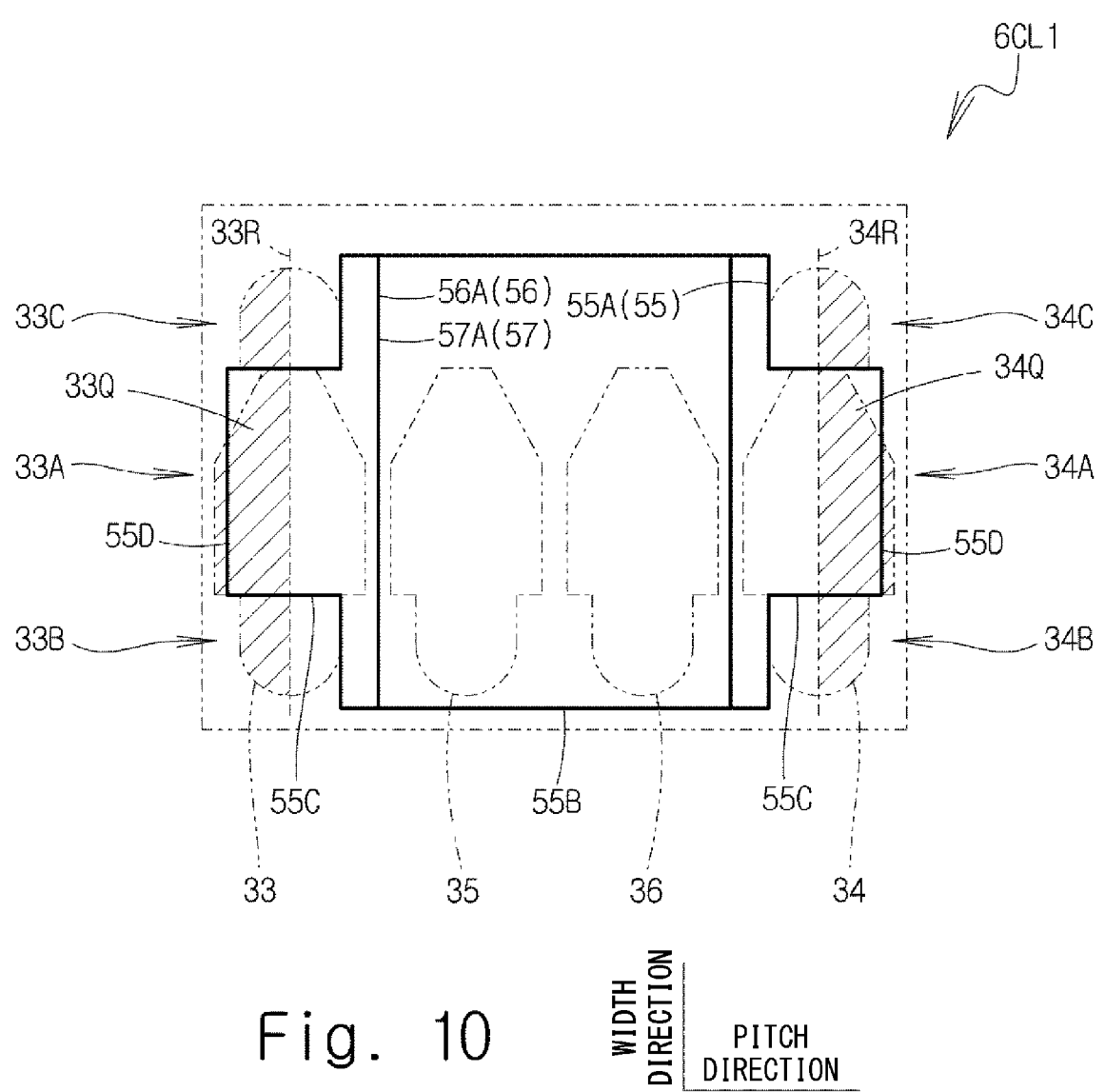
FIG. 10 is a projection view of a plurality of conductor layers of the contact board (first embodiment)

FIG. 10 is a projection view that projects the inner edge 55A of the penetrating hole 55, the inner edge 56A of the penetrating hole 56, and the inner edge 57A of the penetrating hole 57 on the first conductor layer 6CL1 in order to illustrate the positional relationship of the penetrating hole 55, the penetrating hole 56 and the penetrating hole 57 relative to the first conductor layer 6CL1. The inner edge 55A of the penetrating hole 55, the inner edge 56A of the penetrating hole 56, and the inner edge 57A of the penetrating hole 57 are indicated by heavy lines, and the first ground pad 33, the second ground pad 34, the first signal pad 35, and the second signal pad 36 are indicated by alternate long and two short dashes lines. For the purpose of illustration, the outer region 33Q of the first ground pad 33 and the outer region 34Q of the second ground pad 34 are indicated by hatching.

As shown in FIG. 10, in the contact board 6, the penetrating hole 55 is formed in such a way that the first signal pad 35 and the second signal pad 36 are both located inside the inner edge 55A of the penetrating hole 55 when viewed in the vertical direction. Specifically, the inner edge 55A of the penetrating hole 55 surrounds the first signal pad 35 and the second signal pad 36. In other words, the first signal pad 35 and the second signal pad 36 overlap one penetrating hole 55 that is formed in an unbroken manner.

Further, the penetrating hole 55 is formed to overlap the outer region 33Q of the first ground pad 33 and the outer region 34Q of the second ground pad 34 when viewed in the vertical direction. Specifically, one extension part 55C of the penetrating hole 55 extends from the rectangular part 55B across the dividing line 33R in the pitch direction so as to overlap the outer region 33Q of the first ground pad 33, and the other extension part 55C extends from the rectangular part 55B across the dividing line 34R in the pitch direction so as to overlap the outer region 34Q of the second ground pad 34.

To be specific, the rectangular part 55B of the penetrating hole 55 does not overlap the first via connection part 33B and the second via connection part 33C of the first ground pad 33 and the first via connection part 34B and the second via connection part 34C of the second ground pad 34, and is in contact with the first via connection part 33B and the second via connection part 33C of the first ground pad 33 and the first via connection part 34B and the second via connection part 34C of the second ground pad 34 in the pitch direction.

The two extension parts 55C of the penetrating hole 55 do not overlap the first via connection part 33B and the second via connection part 33C of the first ground pad 33 and the first via connection part 34B and the second via connection part 34C of the second ground pad 34, and is in contact with the first via connection part 33B and the second via connection part 33C of the first ground pad 33 and the first via connection part 34B and the second via connection part 34C of the second ground pad 34 in the width direction.

Thus, two partition lines 55D that partition the two extension parts 55C in the inner edge 55A of the penetrating hole 55 in the pitch direction are largely separated from the first signal pad 35 and the second signal pad 36 in the pitch direction. This means that the second conductor layer 6CL2 is away from the first signal pad 35 and the second signal pad 36 in the pitch direction. This allows controlling a decrease in differential impedance in the first signal pad 35 and the second signal pad 36.

Referring still to FIG. 10, in the contact board 6, the penetrating hole 56 and the penetrating hole 57 are formed to completely overlap each other when viewed in the vertical direction. Specifically, the inner edge 56A of the penetrating hole 56 and the inner edge 57A of the penetrating hole 57 overlap when viewed in the vertical direction. The penetrating hole 56 is formed in such a way that the first signal pad 35 and the second signal pad 36 are both located inside the inner edge 56A of the penetrating hole 56. Specifically, the inner edge 56A of the penetrating hole 56 surrounds the first signal pad 35 and the second signal pad 36. In other words, the first signal pad 35 and the second signal pad 36 overlap one penetrating hole 56 that is formed in an unbroken manner. The same applies to the penetrating hole 57.

<Mounting Board 7>

FIGS. 11 to 17 are partial plan views of the first conductor layer 7CL1, the second conductor layer 7CL2, the third conductor layer 7CL3, the fourth conductor layer 7CL4, the fifth conductor layer 7CL5, and the sixth conductor layer 7CL6 of the mounting board 7. In FIGS. 11 to 17, a conductor part is indicated by hatching for the sake of visibility.

Figure 11:
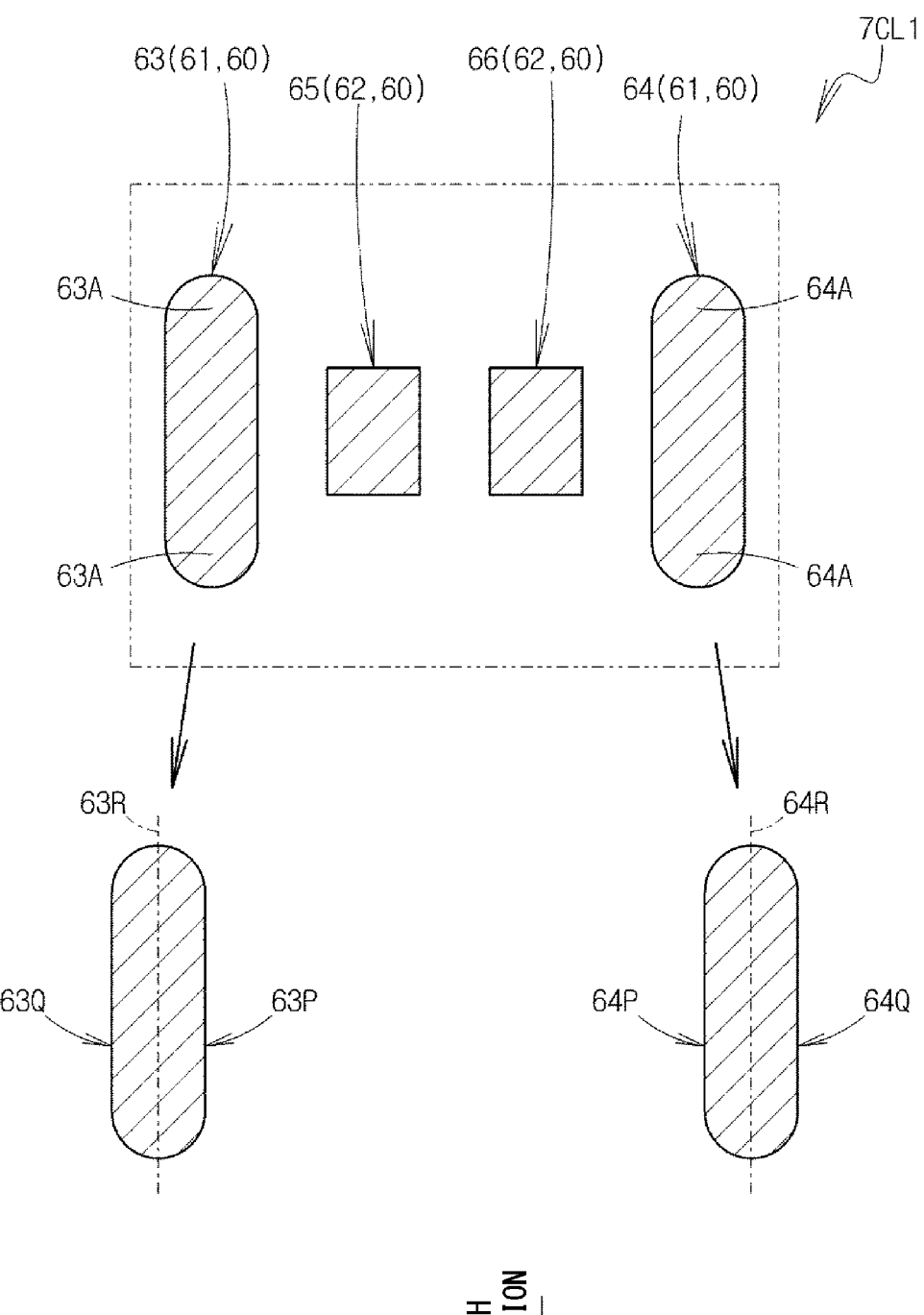
FIG. 11 is a partial plan view of a first conductor layer of a mounting board (first embodiment)

The first conductor layer 7CL1 is described first with reference to FIGS. 1 and 11. As shown in FIGS. 1 and 11, the first conductor layer 7CL1 includes a plurality of electrode pads 60 respectively corresponding to the plurality of compression contacts 11 of the compression connector 5. Specifically, the soldering part 20 of the corresponding compression contact 11 is able to be soldered to each electrode pad 60. The plurality of electrode pads 60 form a plurality of pad rows, just like the plurality of compression contacts 11.

As shown in FIG. 11, in the plurality of electrode pads 60 belonging to each pad row, two ground pads 61 and two signal pads 62 are arranged alternately in the pitch direction. Specifically, the ground pad 61, the ground pad 61, the signal pad 62, the signal pad 62, the ground pad 61, the ground pad 61, the signal pad 62, the signal pad 62 and so on are arranged sequentially in this recited order along the pitch direction. In other words, the two signal pads 62 for differential transmission are disposed between the two ground pads 61. FIG. 11 shows only four electrode pads 60. The four electrode pads 60 shown in FIG. 11 include two ground pads 61 and two signal pads 62 disposed between the two ground pads 61. The two ground pads 61 include a first ground pad 63 and a second ground pad 64. The two signal pads 62 include a first signal pad 65 and a second signal pad 66. The first ground pad 63, the first signal pad 65, the second signal pad 66, and the second ground pad 64 are arranged in this recited order along the pitch direction.

The first signal pad 65 is substantially square. The dimension of the first signal pad 65 in the pitch direction is smaller than that of the first signal pad 35 shown in FIG. 4. Likewise, the dimension of the first signal pad 65 in the width direction is smaller than that of the first signal pad 35 shown in FIG. 4.

The second signal pad 66 is substantially square. The dimension of the second signal pad 66 in the pitch direction is smaller than that of the second signal pad 36 shown in FIG. 4. Likewise, the dimension of the second signal pad 66 in the width direction is smaller than that of the second signal pad 36 shown in FIG. 4.

In this manner, the first signal pad 35 and the second signal pad 36 of the contact board 6 are larger than the first signal pad 65 and the second signal pad 66 of the mounting board 7 in order to absorb the displacement of the contact board 6 relative to the compression connector 5 in the pitch direction and the width direction.

Referring again to FIG. 11, the first ground pad 63 and the second ground pad 64 extend in the width direction.

As shown in FIG. 11, the first signal pad 65 and the second signal pad 66 have the same shape, and the first ground pad 63 and the second ground pad 64 have the same shape.

Referring still to FIG. 11, the first ground pad 63 has an inner region 63P and an outer region 63Q. The inner region 63P is a region closer to the first signal pad 65 relative to a dividing line 63R that divides the pad area of the first ground pad 63 in half in the pitch direction. The outer region 63Q is a region farther from the first signal pad 65 relative to the dividing line 63R. The first ground pad 63 has a symmetrical shape with respect to the dividing line 63R in the pitch direction.

Likewise, the second ground pad 64 has an inner region 64P and an outer region 64Q. The inner region 64P is a region closer to the second signal pad 66 relative to a dividing line 64R that divides the pad area of the second ground pad 64 in half in the pitch direction. The outer region 64Q is a region farther from the second signal pad 66 relative to the dividing line 64R. The second ground pad 64 has a symmetrical shape with respect to the dividing line 64R in the pitch direction.

Figure 16:
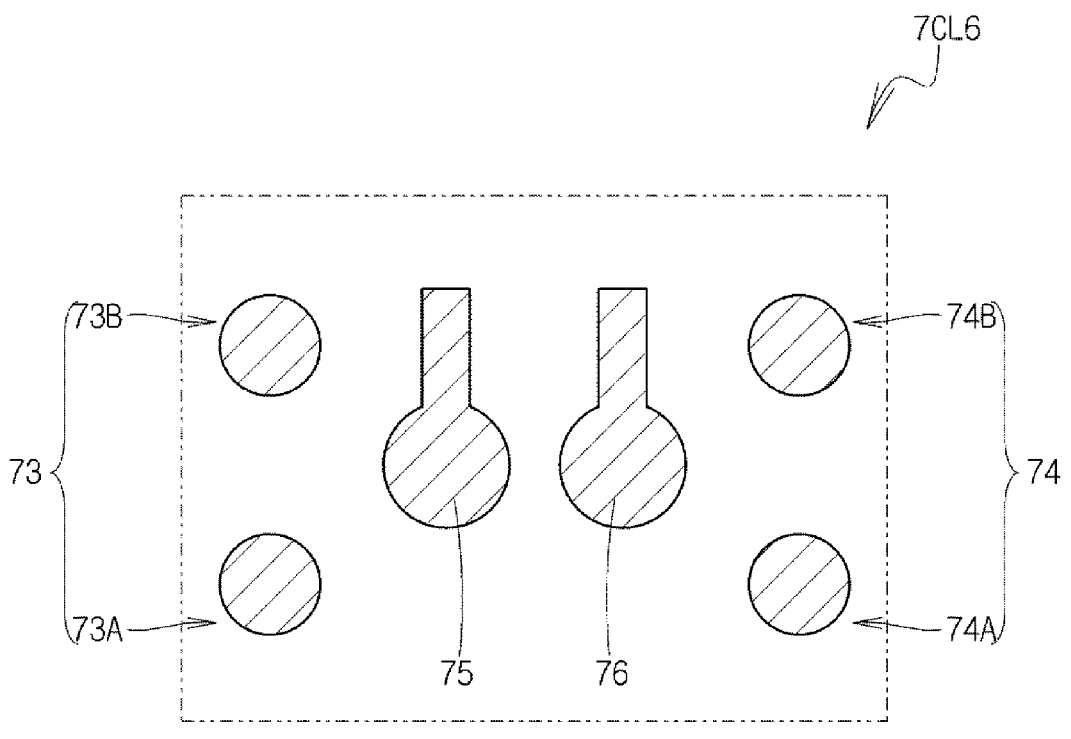
FIG. 16 is a partial plan view of a sixth conductor layer of the mounting board (first embodiment)

Referring next to FIG. 16, the sixth conductor layer 7CL6 is described hereinafter. As shown in FIG. 16, the sixth conductor layer 7CL6 includes a first ground pad 73, a second ground pad 74, a first signal pad 75, and a second signal pad 76 respectively corresponding to the first ground pad 63, the second ground pad 64, the first signal pad 65, and the second signal pad 66 shown in FIG. 11.

The first ground pad 73 includes a first via connection part 73A and a second via connection part 73B. Although the first via connection part 73A and the second via connection part 73B are separated from each other in the width direction, they may be formed integrally.

The second ground pad 74 includes a first via connection part 74A and a second via connection part 74B. Although the first via connection part 74A and the second via connection part 74B are separated from each other in the width direction, they may be formed integrally.

The first via connection part 73A of the first ground pad 73 is electrically connected to an end 63A of the first ground pad 63 in the width direction shown in FIG. 11 through a via hole 80A shown in FIG. 12 and the like. Likewise, the second via connection part 73B of the first ground pad 73 is electrically connected to the end 63A of the first ground pad 63 in the width direction shown in FIG. 11 through a via hole 80B shown in FIG. 12 and the like.

The first via connection part 74A of the second ground pad 74 is electrically connected to an end 64A of the second ground pad 64 in the width direction shown in FIG. 11 through a via hole 81A shown in FIG. 12 and the like. Likewise, the second via connection part 74B of the second ground pad 74 is electrically connected to the end 64A of the second ground pad 64 in the width direction shown in FIG. 11 through a via hole 81B shown in FIG. 12 and the like.

The first signal pad 75 is electrically connected to the first signal pad 65 shown in FIG. 11 through a via hole 82 shown in FIG. 12 and the like.

The second signal pad 76 is electrically connected to the second signal pad 66 shown in FIG. 11 through a via hole 83 shown in FIG. 12 and the like.

The second conductor layer 7CL2 to the fifth conductor layer 7CL5 are described hereinafter with reference to FIGS. 12 to 15. The second conductor layer 7CL2 to the fifth conductor layer 7CL5 are continuous with one another through the via hole 80A, the via hole 80B, the via hole 81A and the via hole 81B, and each of them functions as a ground layer.

As shown in FIG. 12, the second conductor layer 7CL2 has a penetrating hole 85. The penetrating hole 85 has an inner edge 85A. In FIG. 12, the via hole 82 and the via hole 83 are disposed inside the inner edge 85A of the penetrating hole 85. The via hole 80A, the via hole 80B, the via hole 81A and the via hole 81B are disposed outside the inner edge 85A of the penetrating hole 85. The penetrating hole 85 is substantially rectangular.

As shown in FIG. 13, the third conductor layer 7CL3 has a penetrating hole 86. The penetrating hole 86 has an inner edge 86A. In FIG. 13, the via hole 82 and the via hole 83 are disposed inside the inner edge 86A of the penetrating hole 86. The via hole 80A, the via hole 80B, the via hole 81A and the via hole 81B are disposed outside the inner edge 86A of the penetrating hole 86. The penetrating hole 86 is substantially rectangular.

Figure 14:
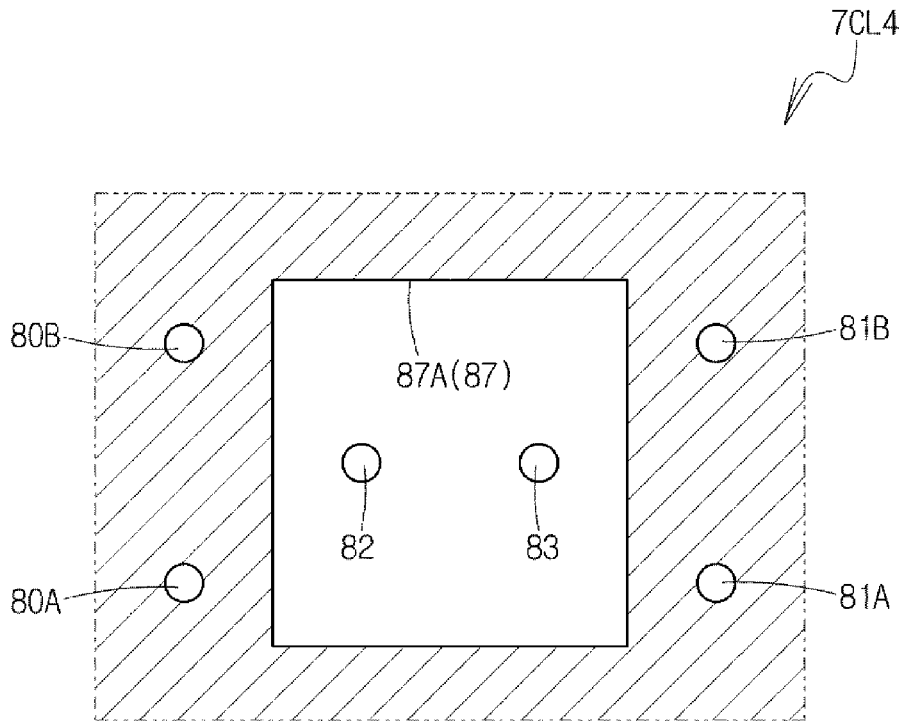
FIG. 14 is a partial plan view of a fourth conductor layer of the mounting board (first embodiment)

As shown in FIG. 14, the fourth conductor layer 7CL4 has a penetrating hole 87. The penetrating hole 87 has an inner edge 87A. In FIG. 14, the via hole 82 and the via hole 83 are disposed inside the inner edge 87A of the penetrating hole 87. The via hole 80A, the via hole 80B, the via hole 81A and the via hole 81B are disposed outside the inner edge 87A of the penetrating hole 87. The penetrating hole 87 is substantially rectangular.

Figure 15:
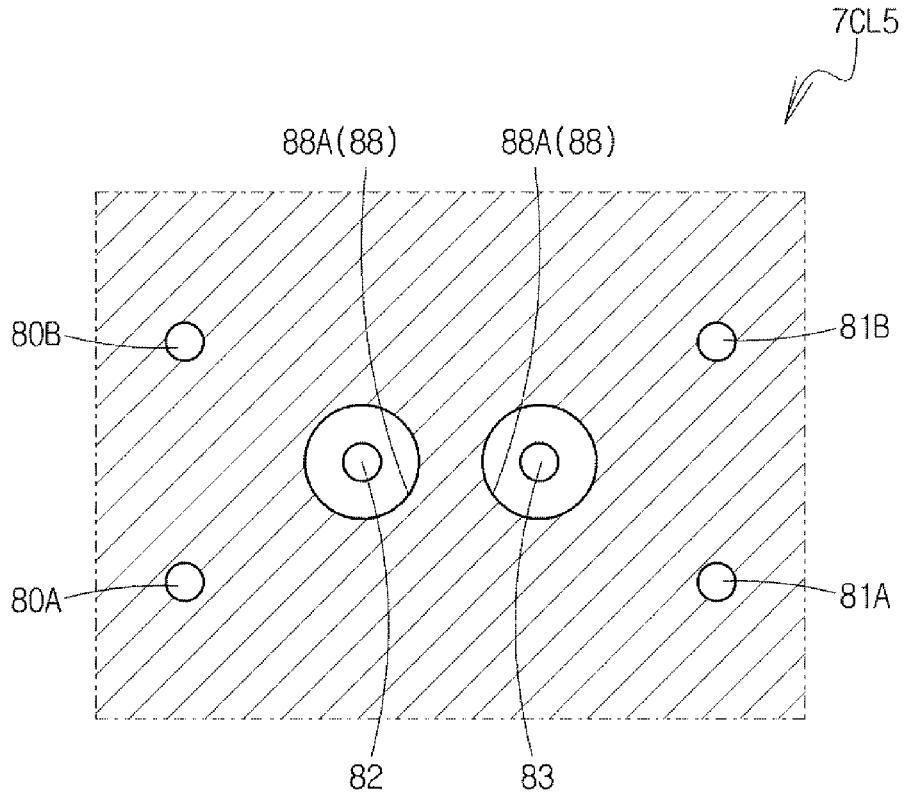
FIG. 15 is a partial plan view of a fifth conductor layer of the mounting board (first embodiment)

As shown in FIG. 15, the fifth conductor layer 7CL5 has two penetrating holes 88. Each penetrating hole 88 has an inner edge 88A. In FIG. 15, the via hole 82 and the via hole 83 are respectively disposed inside the inner edges 88A of the two penetrating holes 88. The via hole 80A, the via hole 80B, the via hole 81A and the via hole 81B are disposed outside the inner edges 88A of the two penetrating holes 88. Each penetrating hole 88 is substantially circular.

Figure 17:
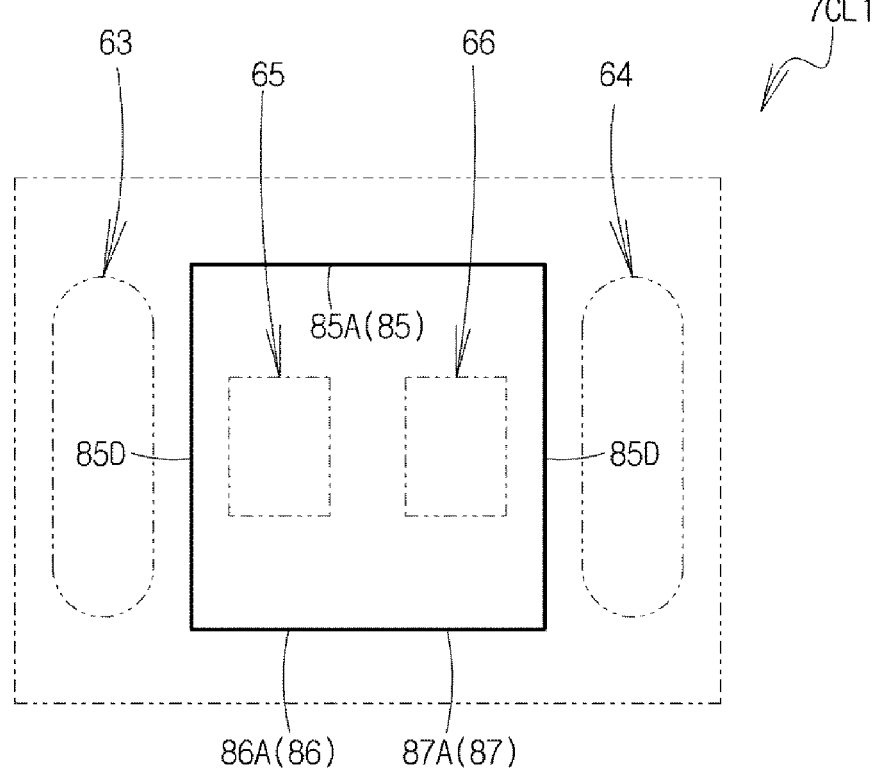
FIG. 17 is a projection view of a plurality of conductor layers of the mounting board (first embodiment)

FIG. 17 is a projection view that projects the inner edge 85A of the penetrating hole 85, the inner edge 86A of the penetrating hole 86, and the inner edge 87A of the penetrating hole 87 on the first conductor layer 7CL1 in order to illustrate the positional relationship of the penetrating hole 85, the penetrating hole 86 and the penetrating hole 87 relative to the first conductor layer 7CL1. The inner edge 85A of the penetrating hole 85, the inner edge 86A of the penetrating hole 86, and the inner edge 87A of the penetrating hole 87 are indicated by heavy lines, and the first ground pad 63, the second ground pad 64, the first signal pad 65, and the second signal pad 66 are indicated by alternate long and two short dashes lines.

As shown in FIG. 17, in the mounting board 7, the penetrating hole 85 is formed in such a way that the first signal pad 65 and the second signal pad 66 are both located inside the inner edge 85A of the penetrating hole 85 when viewed in the vertical direction. Specifically, the inner edge 85A of the penetrating hole 85 surrounds the first signal pad 65 and the second signal pad 66. In other words, the first signal pad 65 and the second signal pad 66 overlap one penetrating hole 85 that is formed in an unbroken manner.

Further, the penetrating hole 85 is separated from the first ground pad 63 and the second ground pad 64 in the pitch direction when viewed in the vertical direction. To be specific, one of two partition lines 85D that partition the penetrating hole 85 in the pitch direction in the inner edge 85A of the penetrating hole 85 is located between the first ground pad 63 and the first signal pad 65 in the pitch direction and at equal distances from the first ground pad 63 and the first signal pad 65, and the other one is located between the second ground pad 64 and the second signal pad 66 in the pitch direction and at equal distances from the second ground pad 64 and the second signal pad 66.

The dimensions in the pitch direction of the first signal pad 65 and the second signal pad 66 are smaller than those of the first signal pad 35 and the second signal pad 36 shown in FIG. 10, and therefore differential impedance does not significantly decrease due to parasitic capacitance. Thus, this is designed to reduce the opening area of the penetrating hole 85 in the second conductor layer 7CL2 and prioritize the electromagnetic shield effect by the second conductor layer 7CL2.

Referring still to FIG. 17, in the mounting board 7, the penetrating hole 85, the penetrating hole 86 and the penetrating hole 87 are formed to completely overlap with one another when viewed in the vertical direction. Specifically, the inner edge 85A of the penetrating hole 85, the inner edge 86A of the penetrating hole 86, and the inner edge 87A of the penetrating hole 87 overlap when viewed in the vertical direction. Thus, the penetrating hole 86 is formed in such a way that the first signal pad 65 and the second signal pad 66 are both located inside the inner edge 86A of the penetrating hole 86. Specifically, the inner edge 86A of the penetrating hole 86 surrounds the first signal pad 65 and the second signal pad 66. In other words, the first signal pad 65 and the second signal pad 66 overlap one penetrating hole 86 that is formed in an unbroken manner. The same applies to the penetrating hole 87.

First Modified Example

Figure 18:
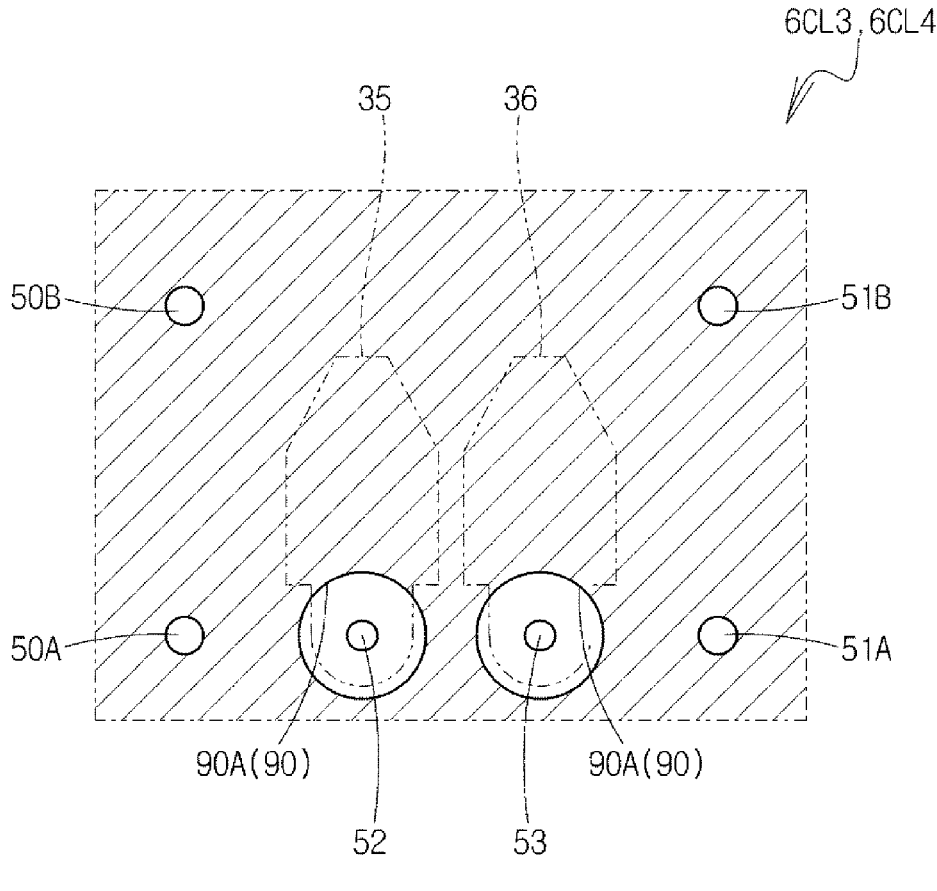
FIG. 18 is a partial bottom view of a third conductor layer and a fourth conductor layer of a contact board (first modified example)
Figure 19:
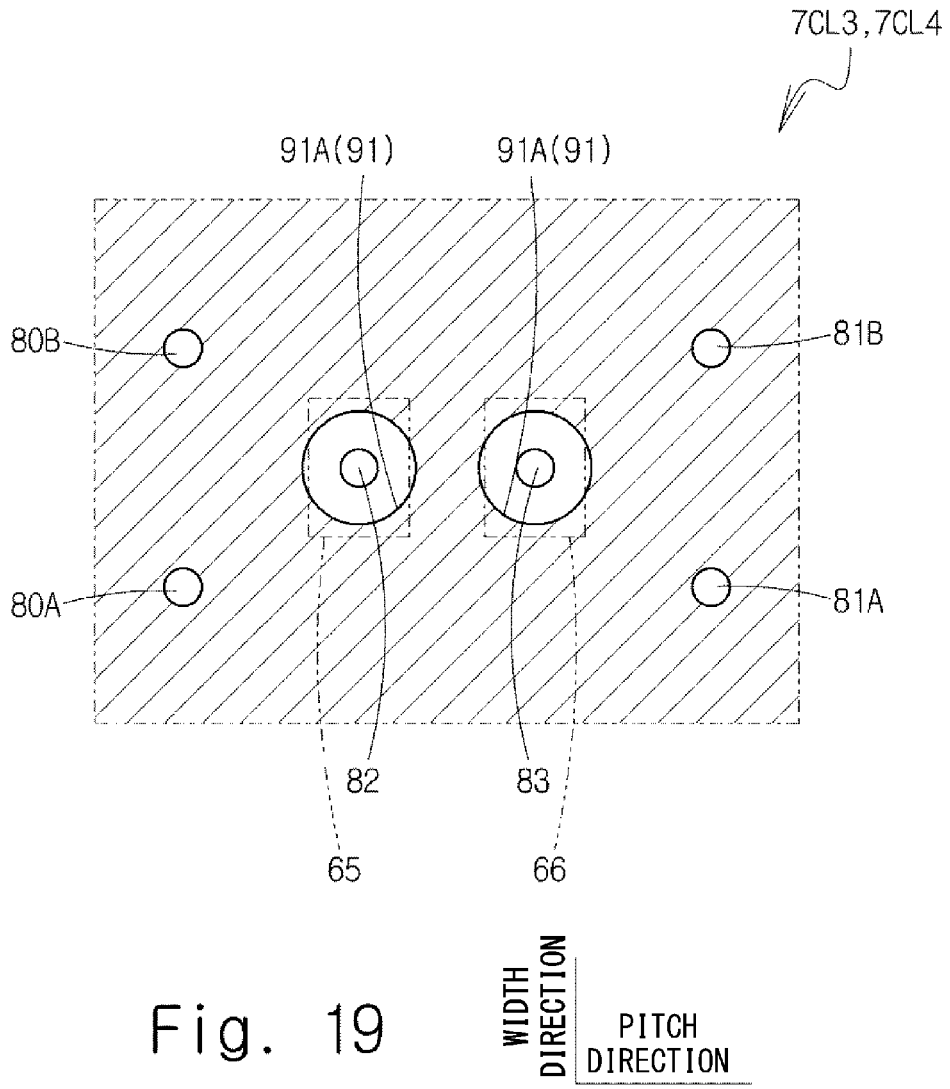
FIG. 19 is a partial plan view of a third conductor layer and a fourth conductor layer of a mounting board (first modified example)

A first modified example of the first embodiment is described hereinafter with reference to FIGS. 18 and 19. In FIGS. 18 and 19, a conductor part is indicated by hatching for the sake of visibility.

As shown in FIG. 18, in the first modified example, the third conductor layer 6CL3 and the fourth conductor layer 6CL4 have the same structure as the fifth conductor layer 6CL5 shown in FIG. 8. Specifically, as shown in FIG. 18, the third conductor layer 6CL3 and the fourth conductor layer 6CL4 have two penetrating holes 90. Each penetrating hole 90 has an inner edge 90A. The via hole 52 and the via hole 53 are respectively located inside the inner edges 90A of the two penetrating holes 90. The via hole 50A, the via hole 50B, the via hole 51A and the via hole 51B are located outside the inner edges 90A of the two penetrating holes 90. Each penetrating hole 90 is substantially circular.

In this manner, the two penetrating holes 90 formed in the third conductor layer 6CL3 and the fourth conductor layer

6CL4 have the minimum necessary size that does not allow the third conductor layer 6CL3 and the fourth conductor layer 6CL4 to be continuous with the via hole 52 and the via hole 53. Thus, the third conductor layer 6CL3 and the fourth conductor layer 6CL4 overlap the first signal pad 35 and the second signal pad 36 indicated by alternate long and two short dashes lines in FIG. 18 when viewed in the vertical direction. This is thereby designed to prioritize the electromagnetic shield effect by the third conductor layer 6CL3 and the fourth conductor layer 6CL4.

Likewise, as shown in FIG. 19, in the first modified example, the third conductor layer 7CL3 and the fourth conductor layer 7CL4 have the same structure as the fifth conductor layer 7CL5 shown in FIG. 15. Specifically, as shown in FIG. 19, the third conductor layer 7CL3 and the fourth conductor layer 7CL4 have two penetrating holes 91. Each penetrating hole 91 has an inner edge 91A. The via hole 82 and the via hole 83 are respectively located inside the inner edges 91A of the two penetrating holes 91. The via hole 80A, the via hole 80B, the via hole 81A and the via hole 81B are located outside the inner edges 91A of the two penetrating holes 91. Each penetrating hole 91 is substantially circular.

In this manner, the two penetrating holes 91 formed in the third conductor layer 7CL3 and the fourth conductor layer 7CL4 have the minimum necessary size that does not allow the third conductor layer 7CL3 and the fourth conductor layer 7CL4 to be continuous with the via hole 82 and the via hole 83. Thus, the third conductor layer 7CL3 and the fourth conductor layer 7CL4 overlap the first signal pad 65 and the second signal pad 66 indicated by alternate long and two short dashes lines in FIG. 19 when viewed in the vertical direction. This is thereby designed to prioritize the electromagnetic shield effect by the third conductor layer 7CL3 and the fourth conductor layer 7CL4.

The above-described first modified example is directly applicable to the second to fifth embodiments described hereinbelow.

Second Embodiment

A second embodiment of the present disclosure is described hereinafter with reference to FIGS. 20 and 21. Differences of this embodiment from the above-described first embodiment are mainly described below, and redundant description thereof is omitted.

<Contact Board 6>

Figure 20:
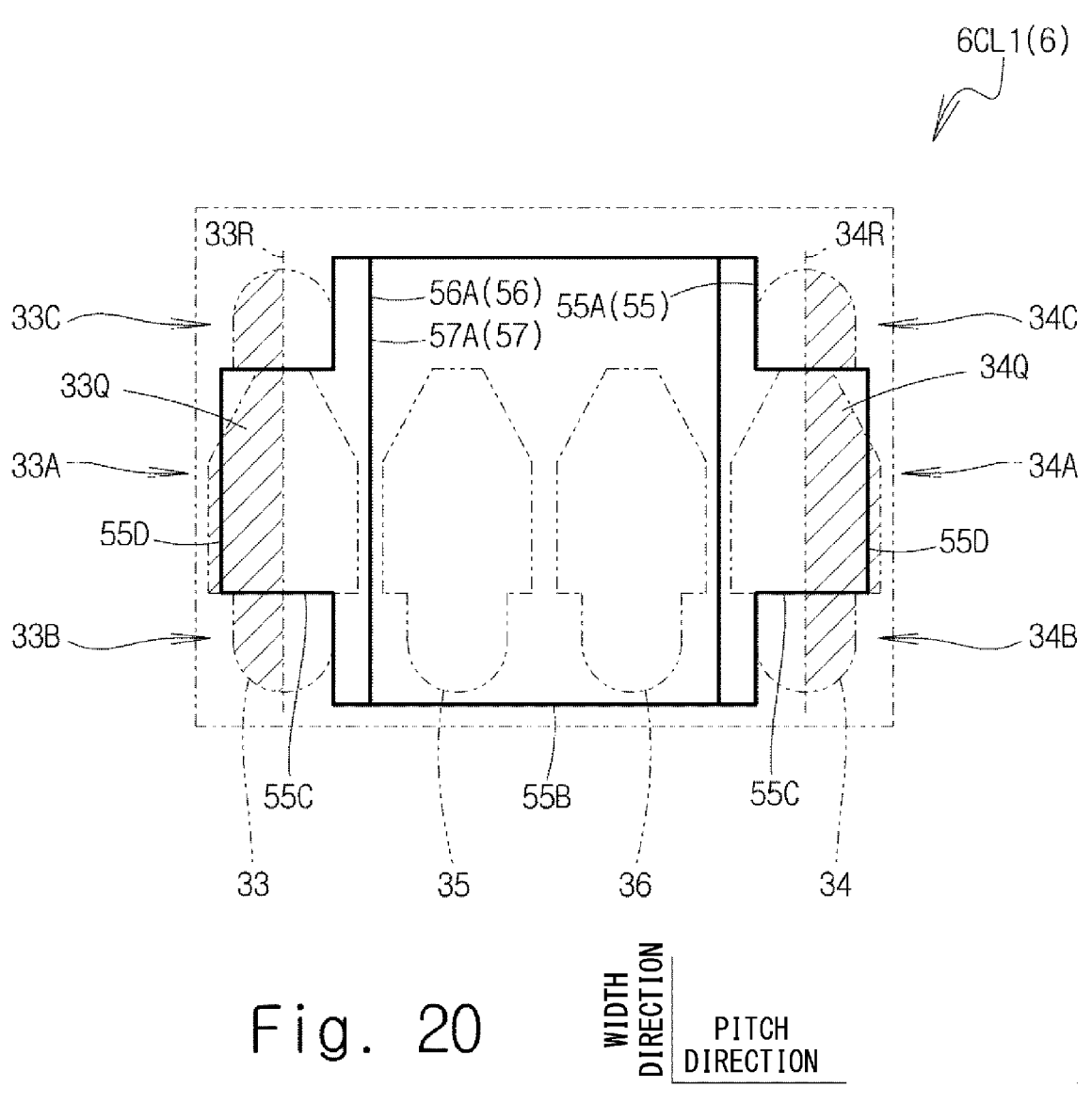
FIG. 20 is a projection view of a plurality of conductor layers of a contact board (second embodiment)

FIG. 20 is a projection view that projects the inner edge 55A of the penetrating hole 55, the inner edge 56A of the penetrating hole 56, and the inner edge 57A of the penetrating hole 57 on the first conductor layer 6CL1 in order to illustrate the positional relationship of the penetrating hole 55, the penetrating hole 56 and the penetrating hole 57 relative to the first conductor layer 6CL1. The inner edge 55A of the penetrating hole 55, the inner edge 56A of the penetrating hole 56, and the inner edge 57A of the penetrating hole 57 are indicated by heavy lines, and the first ground pad 33, the second ground pad 34, the first signal pad 35, and the second signal pad 36 are indicated by alternate long and two short dashes lines. For the purpose of illustration, the outer region 33Q of the first ground pad 33 and the outer region 34Q of the second ground pad 34 are indicated by hatching.

As shown in FIG. 20, the contact board 6 in this embodiment has the same structure as the contact board 6 in the above-described first embodiment shown in FIG. 10.

Specifically, as shown in FIG. 20, in the contact board 6, the penetrating hole 55 is formed in such a way that the first signal pad 35 and the second signal pad 36 are both located inside the inner edge 55A of the penetrating hole 55 when viewed in the vertical direction. Specifically, the inner edge 55A of the penetrating hole 55 surrounds the first signal pad 35 and the second signal pad 36. In other words, the first signal pad 35 and the second signal pad 36 overlap one penetrating hole 55 that is formed in an unbroken manner.

Further, the penetrating hole 55 is formed to overlap the outer region 33Q of the first ground pad 33 and the outer region 34Q of the second ground pad 34 when viewed in the vertical direction. Specifically, one extension part 55C of the penetrating hole 55 extends from the rectangular part 55B across the dividing line 33R in the pitch direction so as to overlap the outer region 33Q of the first ground pad 33, and the other extension part 55C extends from the rectangular part 55B across the dividing line 34R in the pitch direction so as to overlap the outer region 34Q of the second ground pad 34.

Thus, two partition lines 55D that partition the two extension parts 55C in the inner edge 55A of the penetrating hole 55 in the pitch direction are largely separated from the first signal pad 35 and the second signal pad 36 in the pitch direction. This means that the second conductor layer 6CL2 is away from the first signal pad 35 and the second signal pad 36 in the pitch direction. This allows controlling a decrease in differential impedance in the first signal pad 35 and the second signal pad 36.

<Mounting Board 7>

Figure 21:
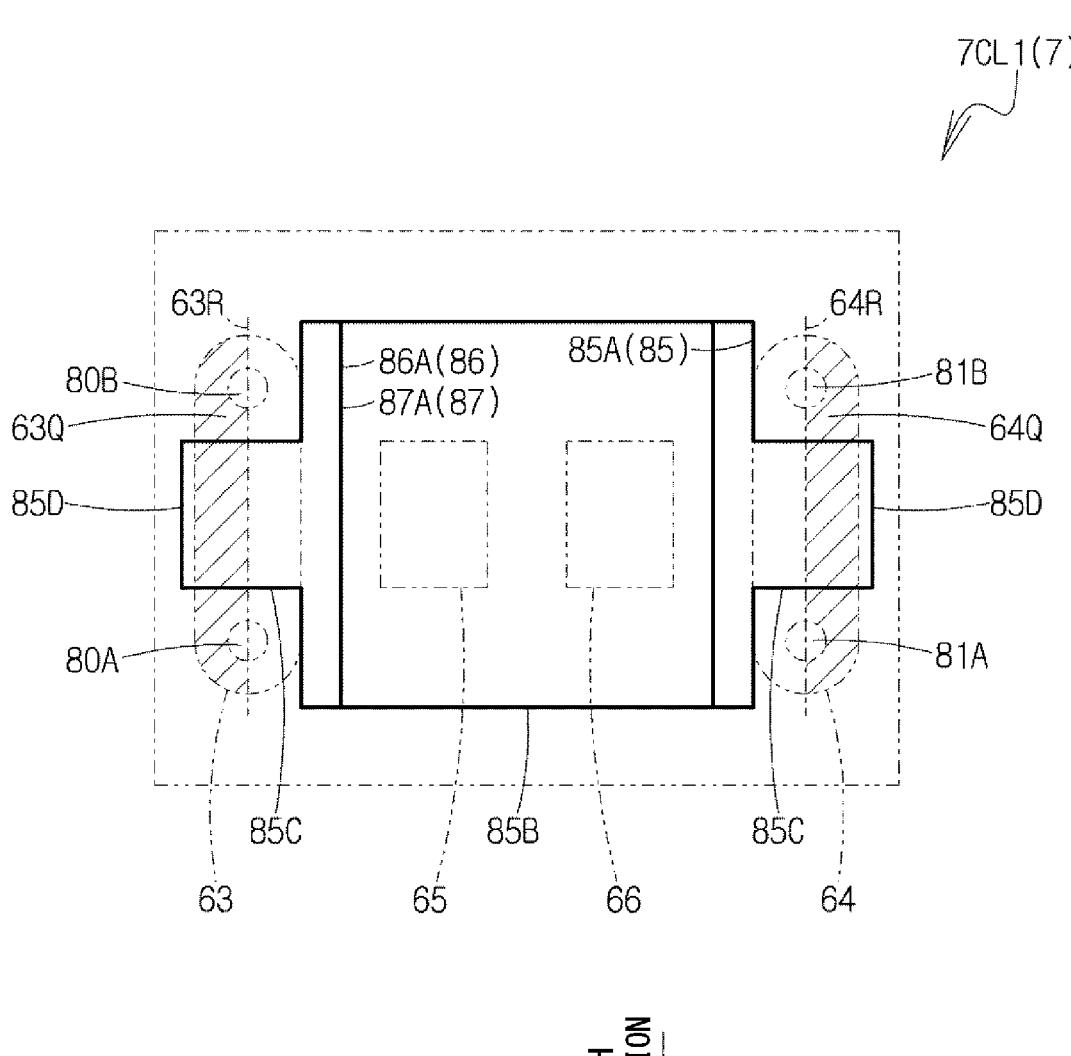
FIG. 21 is a projection view of a plurality of conductor layers of a mounting board (second embodiment)

FIG. 21 is a projection view that projects the inner edge 85A of the penetrating hole 85, the inner edge 86A of the penetrating hole 86, and the inner edge 87A of the penetrating hole 87 on the first conductor layer 7CL1 in order to illustrate the positional relationship of the penetrating hole 85, the penetrating hole 86 and the penetrating hole 87 relative to the first conductor layer 7CL1. The inner edge 85A of the penetrating hole 85, the inner edge 86A of the penetrating hole 86, and the inner edge 87A of the penetrating hole 87 are indicated by heavy lines, and the first ground pad 63, the second ground pad 64, the first signal pad 65, and the second signal pad 66 are indicated by alternate long and two short dashes lines. For the purpose of illustration, the outer region 63Q of the first ground pad 63 and the outer region 64Q of the second ground pad 64 are indicated by hatching.

As shown in FIG. 21, this embodiment is different from the above-described first embodiment in the shape of the penetrating hole 85 of the second conductor layer 7CL2, and the other structure is the same as that of the first embodiment. Specifically, the penetrating hole 85 in this embodiment is wider in the pitch direction than the penetrating hole 85 in the first embodiment shown in FIG. 17.

Specifically, as shown in FIG. 21, the penetrating hole 85 includes a rectangular part 85B that is substantially rectangular and two extension parts 85C that extend from the rectangular part 85B in the pitch direction. One of the two extension parts 85C extends to run between the via hole 80A and the via hole 80B, and the other one extends to run between the via hole 81A and the via hole 81B.

Further, the penetrating hole 85 is formed to overlap the outer region 63Q of the first ground pad 63 and the outer region 64Q of the second ground pad 64 when viewed in the vertical direction. Specifically, one extension part 85C of the penetrating hole 85 extends from the rectangular part 85B across the dividing line 63R in the pitch direction so as to overlap the outer region 63Q of the first ground pad 63, and the other extension part 85C extends from the rectangular part 85B across the dividing line 64R in the pitch direction so as to overlap the outer region 64Q of the second ground pad 64.

Thus, two partition lines 85D that partition the two extension parts 85C in the inner edge 85A of the penetrating hole 85 in the pitch direction are largely separated from the first signal pad 65 and the second signal pad 66 in the pitch direction. This means that the second conductor layer 7CL2 is away from the first signal pad 65 and the second signal pad 66 in the pitch direction. This allows controlling a decrease in differential impedance in the first signal pad 65 and the second signal pad 66.

Third Embodiment

A third embodiment of the present disclosure is described hereinafter with reference to FIGS. 22 and 23. Differences of this embodiment from the above-described first embodiment are mainly described below, and redundant description thereof is omitted.

<Contact Board 6>

Figure 22:
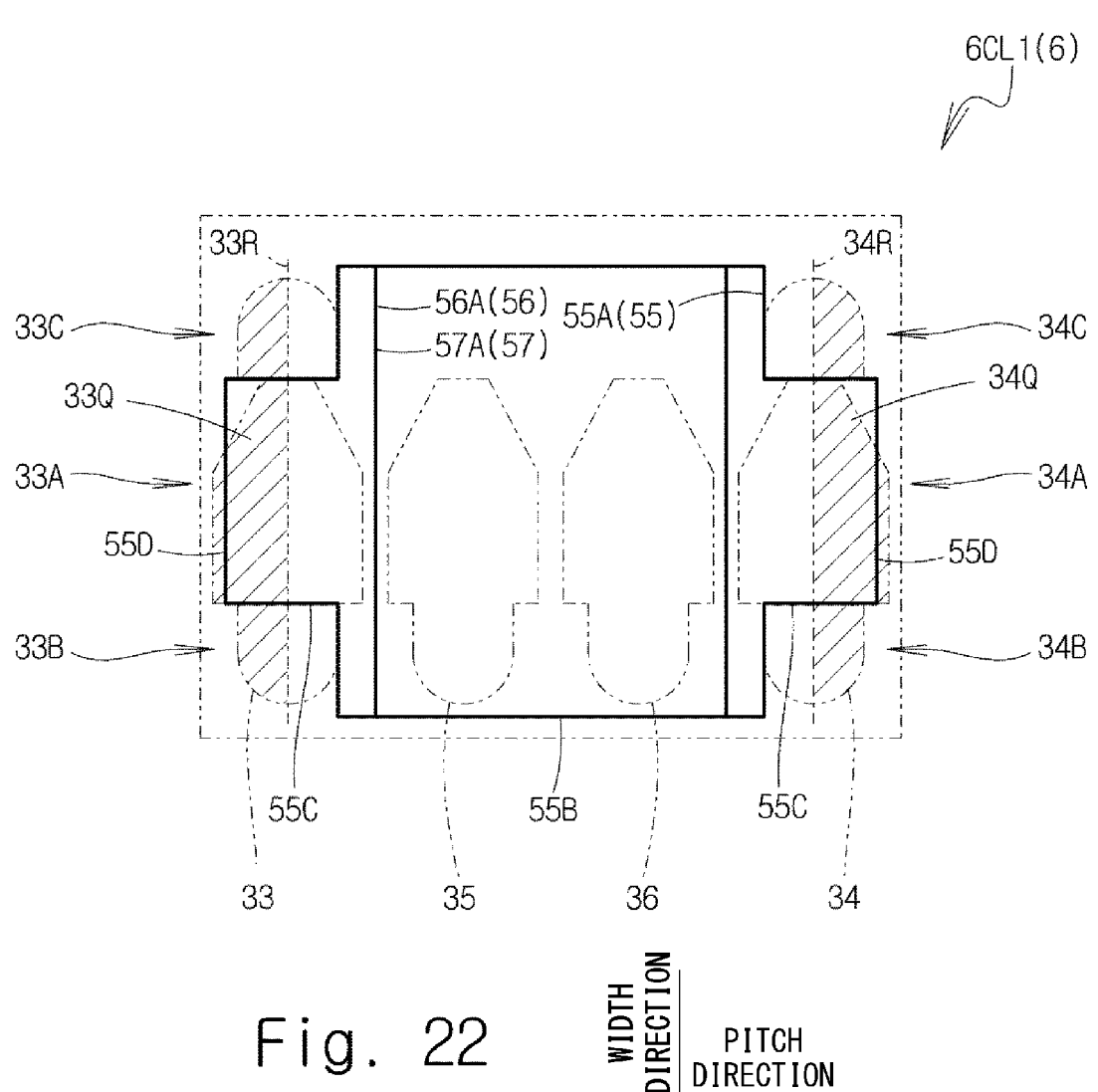
FIG. 22 is a projection view of a plurality of conductor layers of a contact board (third embodiment)

FIG. 22 is a projection view that projects the inner edge 55A of the penetrating hole 55, the inner edge 56A of the penetrating hole 56, and the inner edge 57A of the penetrating hole 57 on the first conductor layer 6CL1 in order to illustrate the positional relationship of the penetrating hole 55, the penetrating hole 56 and the penetrating hole 57 relative to the first conductor layer 6CL1. The inner edge 55A of the penetrating hole 55, the inner edge 56A of the penetrating hole 56, and the inner edge 57A of the penetrating hole 57 are indicated by heavy lines, and the first ground pad 33, the second ground pad 34, the first signal pad 35, and the second signal pad 36 are indicated by alternate long and two short dashes lines. For the purpose of illustration, the outer region 33Q of the first ground pad 33 and the outer region 34Q of the second ground pad 34 are indicated by hatching.

As shown in FIG. 22, the contact board 6 in this embodiment has the same structure as the contact board 6 in the above-described first embodiment shown in FIG. 10.

Specifically, as shown in FIG. 22, in the contact board 6, the penetrating hole 55 is formed in such a way that the first signal pad 35 and the second signal pad 36 are both located inside the inner edge 55A of the penetrating hole 55 when viewed in the vertical direction. Specifically, the inner edge 55A of the penetrating hole 55 surrounds the first signal pad 35 and the second signal pad 36. In other words, the first signal pad 35 and the second signal pad 36 overlap one penetrating hole 55 that is formed in an unbroken manner.

Further, the penetrating hole 55 is formed to overlap the outer region 33Q of the first ground pad 33 and the outer region 34Q of the second ground pad 34 when viewed in the vertical direction. Specifically, one extension part 55C of the penetrating hole 55 extends from the rectangular part 55B across the dividing line 33R in the pitch direction so as to overlap the outer region 33Q of the first ground pad 33, and the other extension part 55C extends from the rectangular part 55B across the dividing line 34R in the pitch direction so as to overlap the outer region 34Q of the second ground pad 34.

Thus, two partition lines 55D that partition the two extension parts 55C in the inner edge 55A of the penetrating hole 55 in the pitch direction are largely separated from the first signal pad 35 and the second signal pad 36 in the pitch direction. This means that the second conductor layer 6CL2 is away from the first signal pad 35 and the second signal pad 36 in the pitch direction. This allows controlling a decrease in differential impedance in the first signal pad 35 and the second signal pad 36.

<Mounting Board 7>

Figure 23:
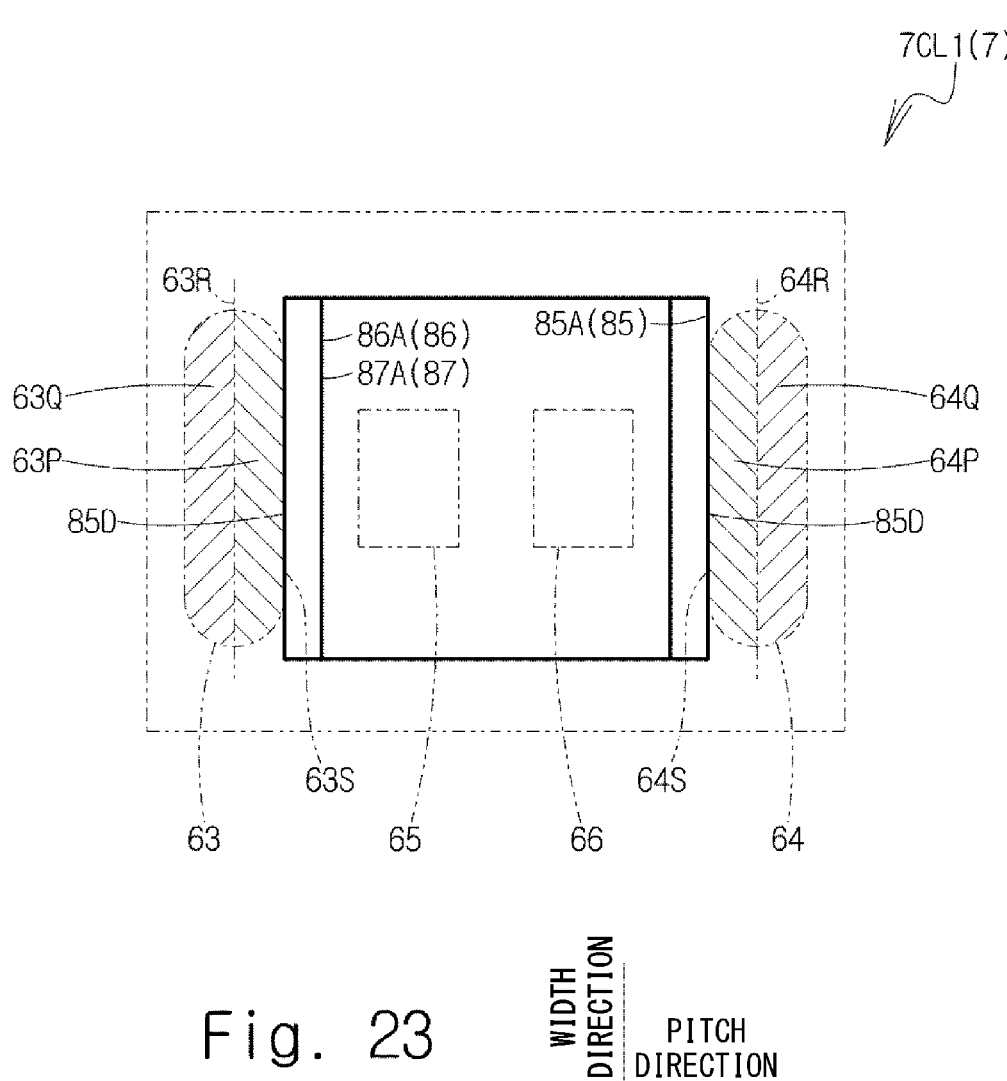
FIG. 23 is a projection view of a plurality of conductor layers of a mounting board (third embodiment)

FIG. 23 is a projection view that projects the inner edge 85A of the penetrating hole 85, the inner edge 86A of the penetrating hole 86, and the inner edge 87A of the penetrating hole 87 on the first conductor layer 7CL1 in order to illustrate the positional relationship of the penetrating hole 85, the penetrating hole 86 and the penetrating hole 87 relative to the first conductor layer 7CL1. The inner edge 85A of the penetrating hole 85, the inner edge 86A of the penetrating hole 86, and the inner edge 87A of the penetrating hole 87 are indicated by heavy lines, and the first ground pad 63, the second ground pad 64, the first signal pad 65, and the second signal pad 66 are indicated by alternate long and two short dashes lines. For the purpose of illustration, the inner region 63P and the outer region 63Q of the first ground pad 63 and the inner region 64P and the outer region 64Q of the second ground pad 64 are indicated by hatching.

As shown in FIG. 23, this embodiment is different from the above-described first embodiment in the shape of the penetrating hole 85 of the second conductor layer 7CL2, and the other structure is the same as that of the first embodiment. Specifically, the penetrating hole 85 in this embodiment is wider in the pitch direction than the penetrating hole 85 in the first embodiment shown in FIG. 17.

To be specific, as shown in FIG. 23, the penetrating hole 85 is formed not to overlap the outer region 63Q of the first ground pad 63 and the outer region 64Q of the second ground pad 64 when viewed in the vertical direction. Further, the penetrating hole 85 is formed not to overlap the inner region 63P of the first ground pad 63 and the inner region 64P of the second ground pad 64 when viewed in the vertical direction. However, the penetrating hole 85 extends in the pitch direction to come into contact with the inner region 63P of the first ground pad 63 and the inner region 64P of the second ground pad 64 when viewed in the vertical direction.

Specifically, one of two partition lines 85D that partition the penetrating hole 85 in the pitch direction in the inner edge 85A of the penetrating hole 85 overlaps an outline 63S of the first ground pad 63 on the first signal pad 65 side, and the other one overlaps an outline 64S of the second ground pad 64 on the second signal pad 66 side. In this manner, the second conductor layer 7CL2 is away from the first signal pad 65 and the second signal pad 66 in the pitch direction, so that it is designed to control a decrease in differential impedance in the first signal pad 65 and the second signal pad 66, and reduce the opening area of the penetrating hole 85 in the second conductor layer 7CL2 and enhance the electromagnetic shield effect by the second conductor layer 7CL2.

Note that, however, in this embodiment, the penetrating hole 85 may be formed to overlap the inner region 63P of the first ground pad 63 and the inner region 64P of the second ground pad 64 as long as it does not overlap the outer region 63Q of the first ground pad 63 and the outer region 64Q of the second ground pad 64 when viewed in the vertical direction. Specifically, the penetrating hole 85 may run across the outline 63S of the first ground pad 63 in the pitch direction and overlap the inner region 63P, and may run across the outline 64S of the second ground pad 64 in the pitch direction and overlap the inner region 64P. In this case also, the effect of controlling a decrease in differential impedance in the first signal pad 65 and the second signal pad 66 and the electromagnetic shield effect by the second conductor layer 7CL2 are achieved at the same time.

Fourth Embodiment

A fourth embodiment of the present disclosure is described hereinafter with reference to FIGS. 24 and 25. Differences of this embodiment from the above-described first embodiment are mainly described below, and redundant description thereof is omitted.

<Contact Board 6>

Figure 24:
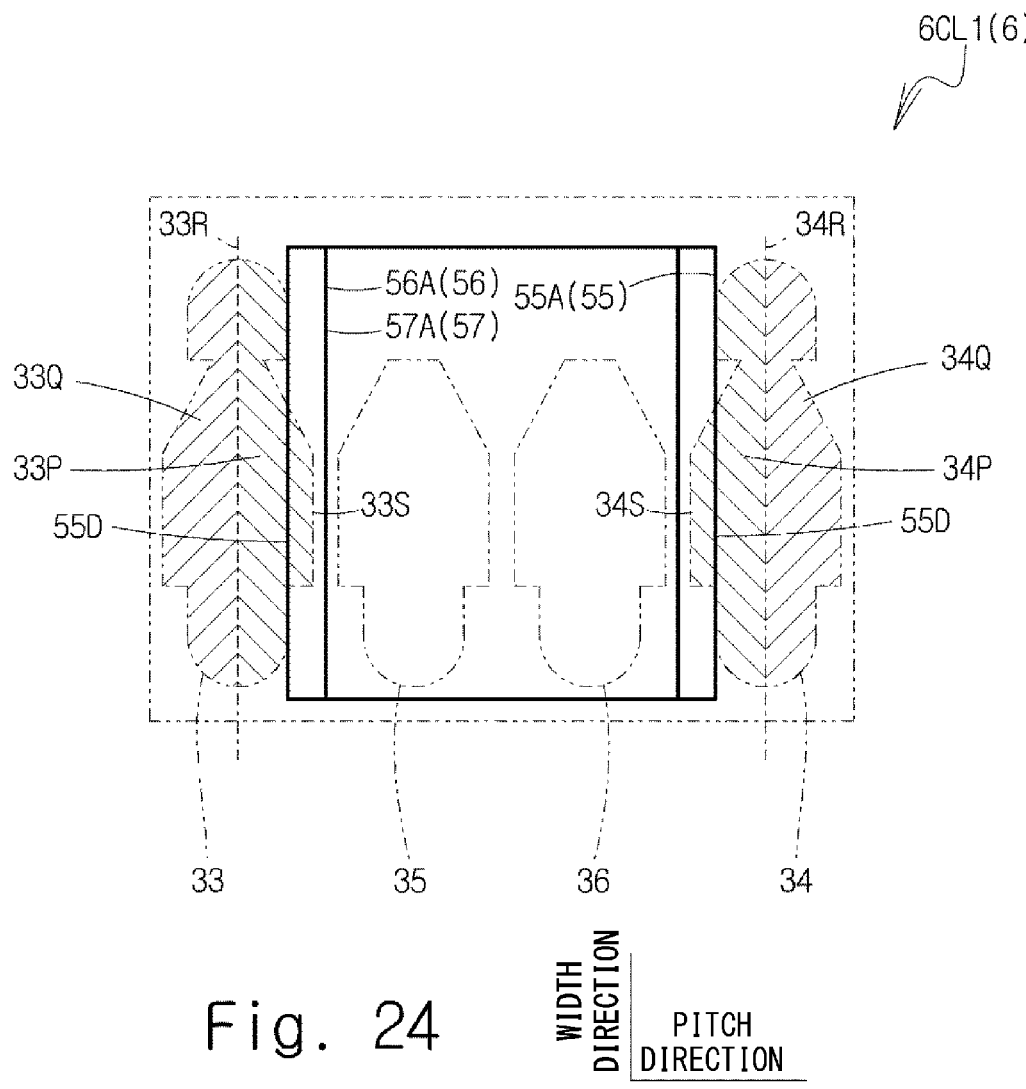
FIG. 24 is a projection view of a plurality of conductor layers of a contact board (fourth embodiment)

FIG. 24 is a projection view that projects the inner edge 55A of the penetrating hole 55, the inner edge 56A of the penetrating hole 56, and the inner edge 57A of the penetrating hole 57 on the first conductor layer 6CL1 in order to illustrate the positional relationship of the penetrating hole 55, the penetrating hole 56 and the penetrating hole 57 relative to the first conductor layer 6CL1. The inner edge 55A of the penetrating hole 55, the inner edge 56A of the penetrating hole 56, and the inner edge 57A of the penetrating hole 57 are indicated by heavy lines, and the first ground pad 33, the second ground pad 34, the first signal pad 35, and the second signal pad 36 are indicated by alternate long and two short dashes lines. For the purpose of illustration, the inner region 33P and the outer region 33Q of the first ground pad 33 and the inner region 34P and the outer region 34Q of the second ground pad 34 are indicated by hatching.

As shown in FIG. 24, this embodiment is different from the above-described first embodiment in the shape of the penetrating hole 55 of the first conductor layer 6CL1, and the other structure is the same as that of the first embodiment. Specifically, the penetrating hole 55 in this embodiment is narrower in the pitch direction than the penetrating hole 55 in the first embodiment shown in FIG. 10. Further, the penetrating hole 55 in this embodiment is substantially rectangular.

To be specific, as shown in FIG. 24, the penetrating hole 55 is formed so as not to overlap the outer region 33Q of the first ground pad 33 and the outer region 34Q of the second ground pad 34 when viewed in the vertical direction. However, the penetrating hole 55 extends in the pitch direction so as to overlap the inner region 33P of the first ground pad 33 and the inner region 34P of the second ground pad 34 when viewed in the vertical direction. Specifically, the penetrating hole 55 runs across an outline 33S of the first ground pad 33 on the first signal pad 35 side in the pitch direction and overlaps the inner region 33P, and further runs across an outline 34S of the second ground pad 34 on the second signal pad 36 side in the pitch direction and overlaps the inner region 34P. In this manner, the second conductor layer 6CL2 is away from the first signal pad 35 and the second signal pad 36 in the pitch direction, so that it is designed to control a decrease in differential impedance in the first signal pad 35 and the second signal pad 36, and reduce the opening area of the penetrating hole 55 in the second conductor layer 6CL2 and enhance the electromagnetic shield effect by the second conductor layer 6CL2.

Note that, in this embodiment, one of the two partition lines 55D that partition the penetrating hole 55 in the pitch direction in the inner edge 55A of the penetrating hole 55 may overlap the outline 33S of the first ground pad 33, and the other one may overlap the outline 34S of the second ground pad 34. In other words, the penetrating hole 55 may be formed to come into contact with the inner region 33P of the first ground pad 33 and the inner region 34P of the second ground pad 34 when viewed in the vertical direction. In this case also, the effect of controlling a decrease in differential impedance in the first signal pad 35 and the second signal pad 36 and the electromagnetic shield effect by the second conductor layer 6CL2 are achieved at the same time.

<Mounting Board 7>

Figure 25:
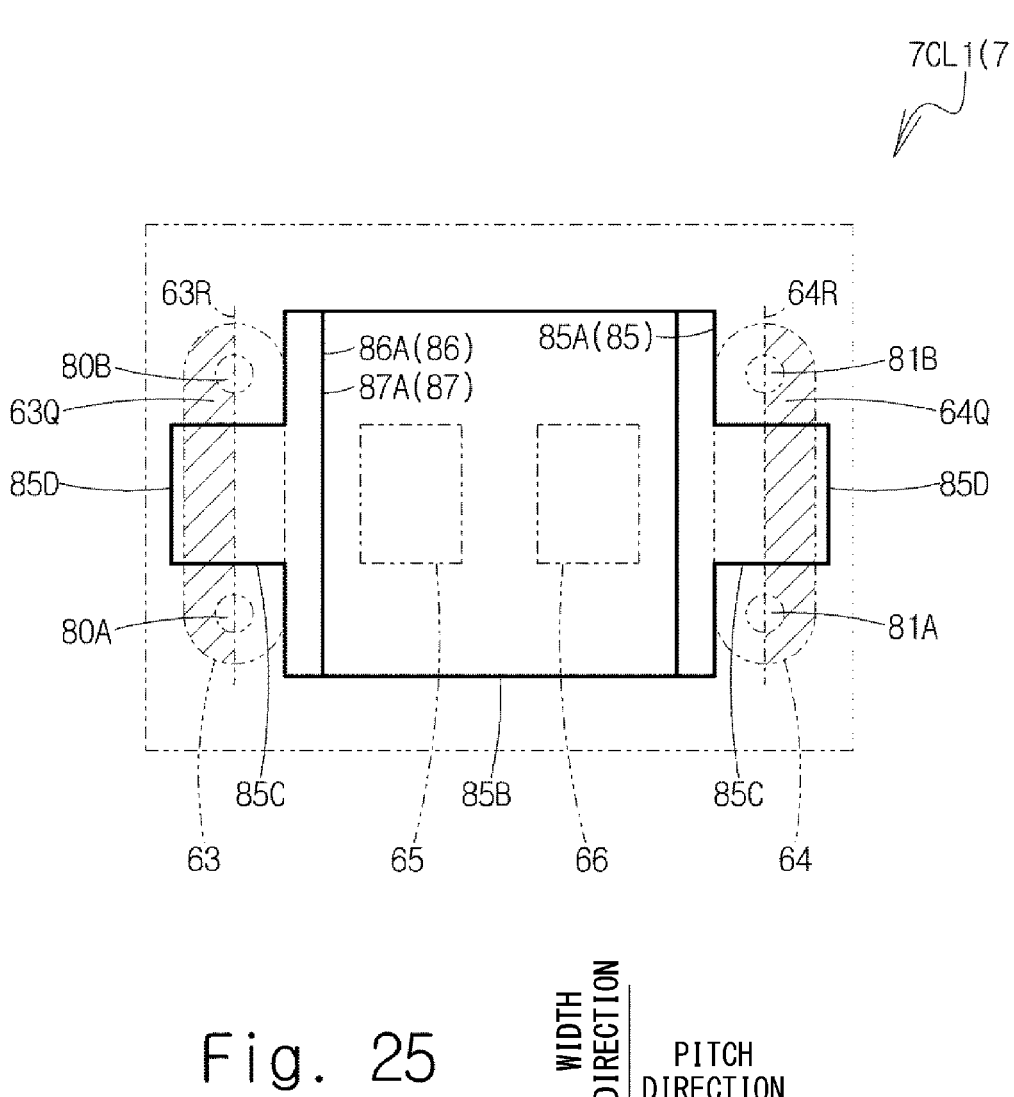
FIG. 25 is a projection view of a plurality of conductor layers of a mounting board (fourth embodiment)

FIG. 25 is a projection view that projects the inner edge 85A of the penetrating hole 85, the inner edge 86A of the penetrating hole 86, and the inner edge 87A of the penetrating hole 87 on the first conductor layer 7CL1 in order to illustrate the positional relationship of the penetrating hole 85, the penetrating hole 86 and the penetrating hole 87 relative to the first conductor layer 7CL1. The inner edge 85A of the penetrating hole 85, the inner edge 86A of the penetrating hole 86, and the inner edge 87A of the penetrating hole 87 are indicated by heavy lines, and the first ground pad 63, the second ground pad 64, the first signal pad 65, and the second signal pad 66 are indicated by alternate long and two short dashes lines. For the purpose of illustration, the outer region 63Q of the first ground pad 63 and the outer region 64Q of the second ground pad 64 are indicated by hatching.

As shown in FIG. 25, this embodiment is different from the above-described first embodiment in the shape of the penetrating hole 85 of the second conductor layer 7CL2, and the other structure is the same as that of the first embodiment. Specifically, the penetrating hole 85 in this embodiment is wider in the pitch direction than the penetrating hole 85 in the first embodiment shown in FIG. 17.

Specifically, as shown in FIG. 25, the penetrating hole 85 includes a rectangular part 85B that is substantially rectangular and two extension parts 85C that extend from the rectangular part 85B in the pitch direction. One of the two extension parts 85C extends to run between the via hole 80A and the via hole 80B, and the other one extends to run between the via hole 81A and the via hole 81B.

Further, the penetrating hole 85 is formed to overlap the outer region 63Q of the first ground pad 63 and the outer region 64Q of the second ground pad 64 when viewed in the vertical direction. Specifically, one extension part 85C of the penetrating hole 85 extends from the rectangular part 85B across the dividing line 63R in the pitch direction so as to overlap the outer region 63Q of the first ground pad 63, and the other extension part 85C extends from the rectangular part 85B across the dividing line 64R in the pitch direction so as to overlap the outer region 64Q of the second ground pad 64.

Thus, two partition lines 85D that partition the two extension parts 85C in the inner edge 85A of the penetrating hole 85 in the pitch direction are largely separated from the first signal pad 65 and the second signal pad 66 in the pitch direction. This means that the second conductor layer 7CL2 is away from the first signal pad 65 and the second signal pad 66 in the pitch direction. This allows controlling a decrease in differential impedance in the first signal pad 65 and the second signal pad 66.

Fifth Embodiment

A fifth embodiment of the present disclosure is described hereinafter with reference to FIGS. 26 and 27. Differences of this embodiment from the above-described first embodiment are mainly described below, and redundant description thereof is omitted.

<Contact Board 6>

Figure 26:
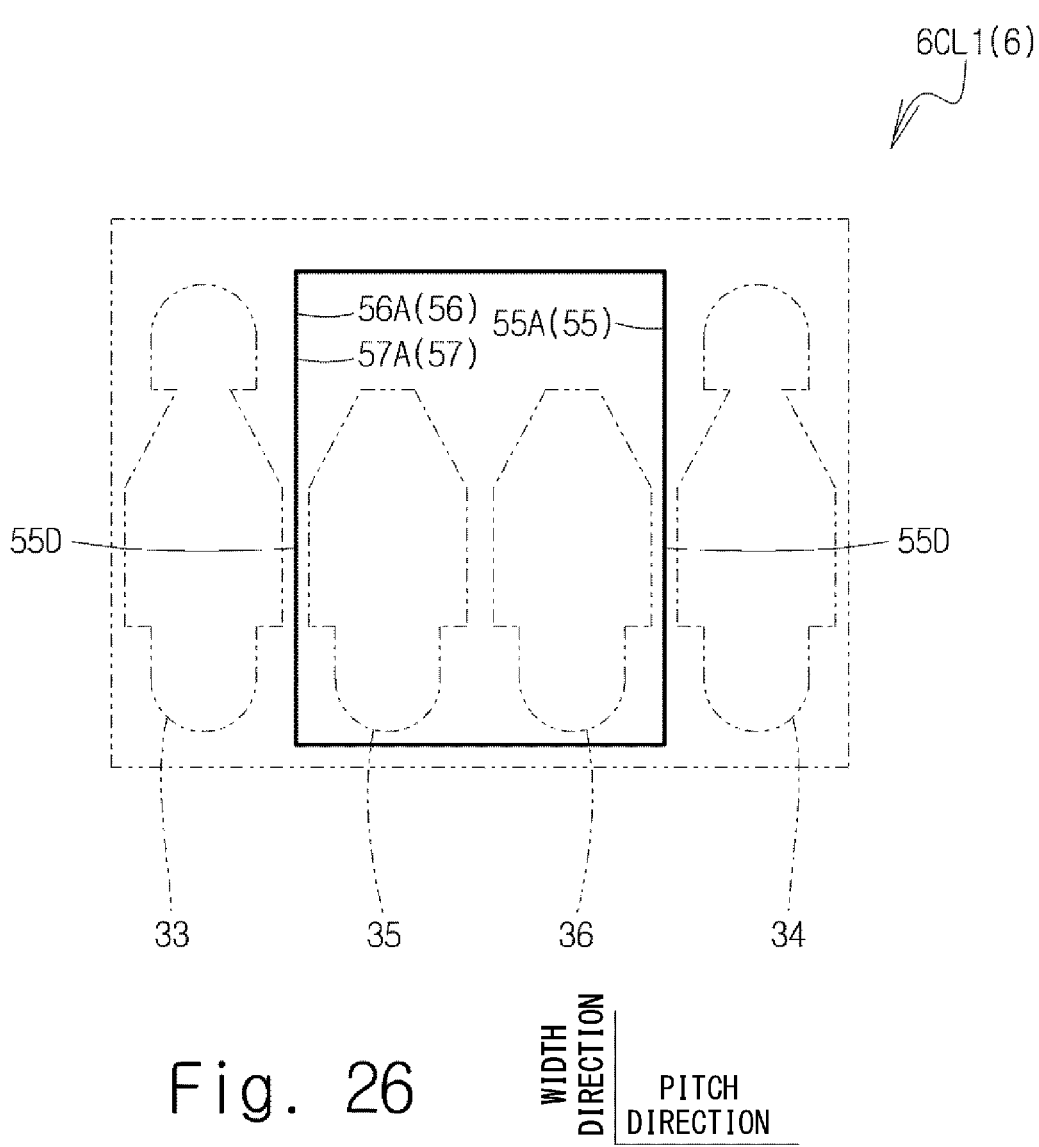
FIG. 26 is a projection view of a plurality of conductor layers of a contact board (fifth embodiment)

FIG. 26 is a projection view that projects the inner edge 55A of the penetrating hole 55, the inner edge 56A of the penetrating hole 56, and the inner edge 57A of the penetrating hole 57 on the first conductor layer 6CL1 in order to illustrate the positional relationship of the penetrating hole 55, the penetrating hole 56 and the penetrating hole 57 relative to the first conductor layer 6CL1. The inner edge 55A of the penetrating hole 55, the inner edge 56A of the penetrating hole 56, and the inner edge 57A of the penetrating hole 57 are indicated by heavy lines, and the first ground pad 33, the second ground pad 34, the first signal pad 35, and the second signal pad 36 are indicated by alternate long and two short dashes lines.

As shown in FIG. 26, this embodiment is different from the above-described first embodiment in the shape of the penetrating hole 55 of the first conductor layer 6CL1, and the other structure is the same as that of the first embodiment. Specifically, the penetrating hole 55 in this embodiment is narrower in the pitch direction than the penetrating hole 55 in the first embodiment shown in FIG. 10. Further, the penetrating hole 55 in this embodiment is substantially rectangular.

To be specific, as shown in FIG. 26, the penetrating hole 55 is formed to be separated from the first ground pad 33 and the second ground pad 34 in the pitch direction when viewed in the vertical direction. To be specific, one of the two partition lines 55D that partition the penetrating hole 55 in the pitch direction is located between the first ground pad 33 and the first signal pad 35 in the pitch direction and at equal distances from the first ground pad 33 and the first signal pad 35, and the other one is located between the second ground pad 34 and the second signal pad 36 in the pitch direction and at equal distances from the second ground pad 34 and the second signal pad 36. In this manner, this is designed to reduce the opening area of the penetrating hole 55 in the second conductor layer 6CL2 and prioritize the electromagnetic shield effect by the second conductor layer 6CL2.

<Mounting Board 7>

Figure 27:
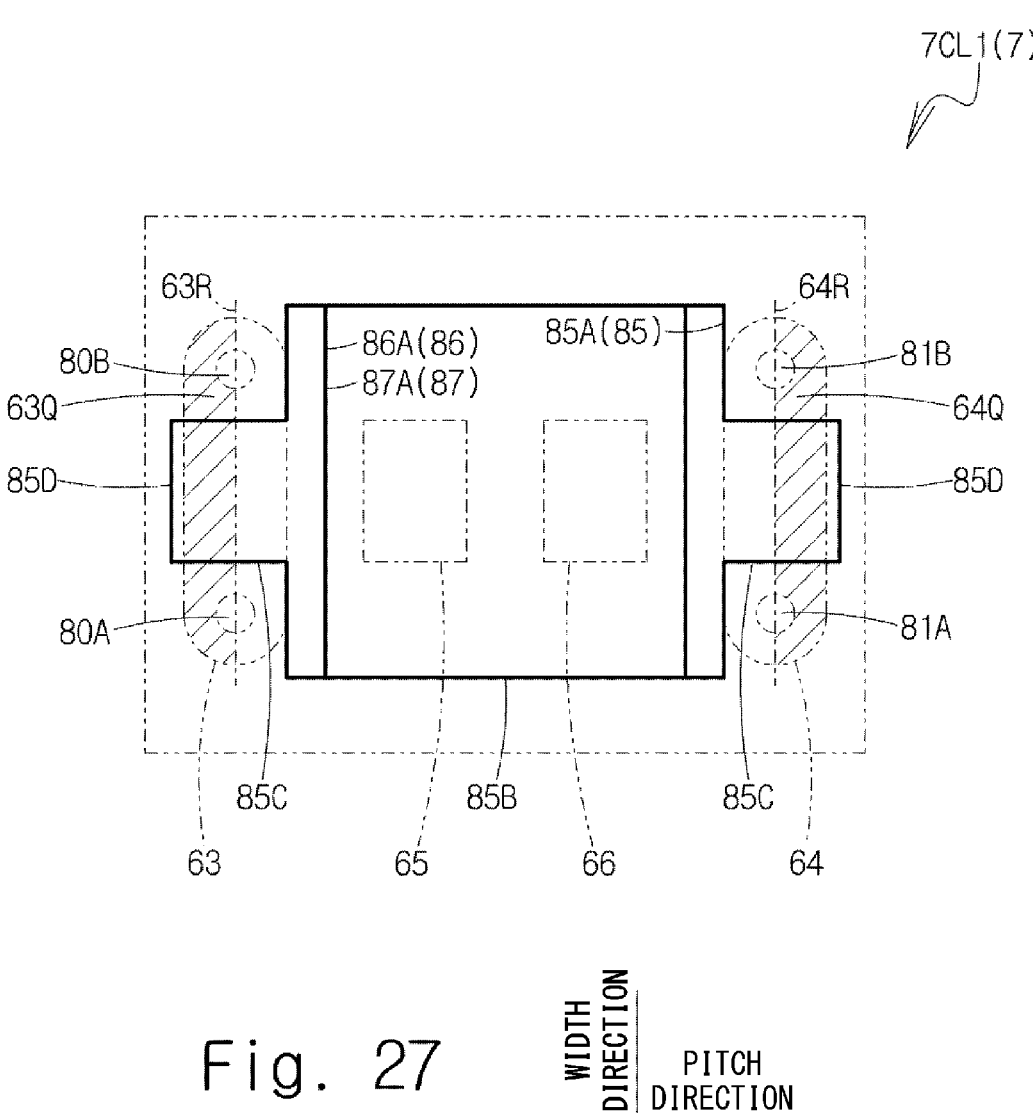
FIG. 27 is a projection view of a plurality of conductor layers of a mounting board (fifth embodiment)

FIG. 27 is a projection view that projects the inner edge 85A of the penetrating hole 85, the inner edge 86A of the penetrating hole 86, and the inner edge 87A of the penetrating hole 87 on the first conductor layer 7CL1 in order to illustrate the positional relationship of the penetrating hole 85, the penetrating hole 86 and the penetrating hole 87 relative to the first conductor layer 7CL1. The inner edge 85A of the penetrating hole 85, the inner edge 86A of the penetrating hole 86, and the inner edge 87A of the penetrating hole 87 are indicated by heavy lines, and the first ground pad 63, the second ground pad 64, the first signal pad 65, and the second signal pad 66 are indicated by alternate long and two short dashes lines. For the purpose of illustration, the outer region 63Q of the first ground pad 63 and the outer region 64Q of the second ground pad 64 are indicated by hatching.

As shown in FIG. 27, this embodiment is different from the above-described first embodiment in the shape of the penetrating hole 85 of the second conductor layer 7CL2, and the other structure is the same as that of the first embodiment. Specifically, the penetrating hole 85 in this embodiment is wider in the pitch direction than the penetrating hole 85 in the first embodiment shown in FIG. 17.

Specifically, as shown in FIG. 27, the penetrating hole 85 includes a rectangular part 85B that is substantially rectangular and two extension parts 85C that extend from the rectangular part 85B in the pitch direction. One of the two extension parts 85C extends to run between the via hole 80A and the via hole 80B, and the other one extends to run between the via hole 81A and the via hole 81B.

Further, the penetrating hole 85 is formed to overlap the outer region 63Q of the first ground pad 63 and the outer region 64Q of the second ground pad 64 when viewed in the vertical direction. Specifically, one extension part 85C of the penetrating hole 85 extends from the rectangular part 85B across the dividing line 63R in the pitch direction so as to overlap the outer region 63Q of the first ground pad 63, and the other extension part 85C extends from the rectangular part 85B across the dividing line 64R in the pitch direction so as to overlap the outer region 64Q of the second ground pad 64.

Thus, two partition lines 85D that partition the two extension parts 85C in the inner edge 85A of the penetrating hole 85 in the pitch direction are largely separated from the first signal pad 65 and the second signal pad 66 in the pitch direction. This means that the second conductor layer 7CL2 is away from the first signal pad 65 and the second signal pad 66 in the pitch direction. This allows controlling a decrease in differential impedance in the first signal pad 65 and the second signal pad 66.

Comparative Example

A comparative example of the present disclosure is described hereinafter with reference to FIGS. 28 and 29. Differences of this comparative example from the above-described first embodiment are mainly described below, and redundant description thereof is omitted.

Figure 28:
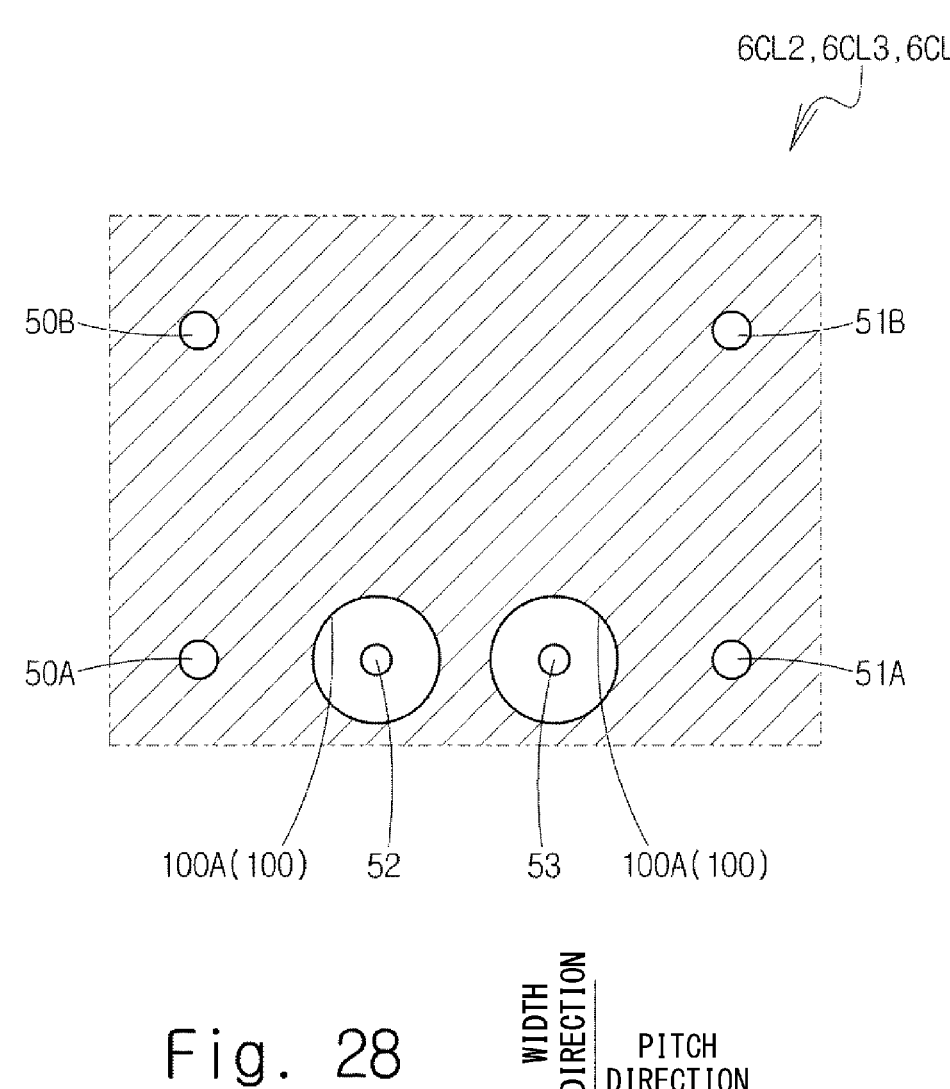
FIG. 28 is a partial bottom view of a second conductor layer to a fourth conductor layer of a contact board (comparative example)

FIG. 28 is a partial bottom view of the second conductor layer 6CL2, the third conductor layer 6CL3, and the fourth conductor layer 6CL4 of the contact board 6 in the comparative example. FIG. 29 is a partial bottom view of the second conductor layer 7CL2, the third conductor layer 7CL3, and the fourth conductor layer 7CL4 of the mounting board 7 in the comparative example. In FIGS. 28 to 29, a conductor part is indicated by hatching for the sake of visibility.

The comparative example is different from the above-described first embodiment in the shape of the second conductor layer 6CL2, the third conductor layer 6CL3 and the fourth conductor layer 6CL4 of the contact board 6 and the second conductor layer 7CL2, the third conductor layer 7CL3 and the fourth conductor layer 7CL4 of the mounting board 7, and the other structure is the same as that of the first embodiment.

<Contact Board 6>

As shown in FIG. 28, the second conductor layer 6CL2 has two penetrating holes 100 in place of the penetrating hole 55 shown in FIG. 5. Each penetrating hole 100 has an inner edge 100A. In FIG. 28, the via hole 52 and the via hole 53 are respectively disposed inside the inner edges 100A of the two penetrating holes 100. The via hole 50A, the via hole 50B, the via hole 51A and the via hole 51B are disposed outside the inner edges 100A of the two penetrating holes 100. Each penetrating hole 100 is substantially circular. The third conductor layer 6CL3 and the fourth conductor layer 6CL4 have the same shape as the second conductor layer 6CL2.

<Mounting Board 7>

Figure 29:
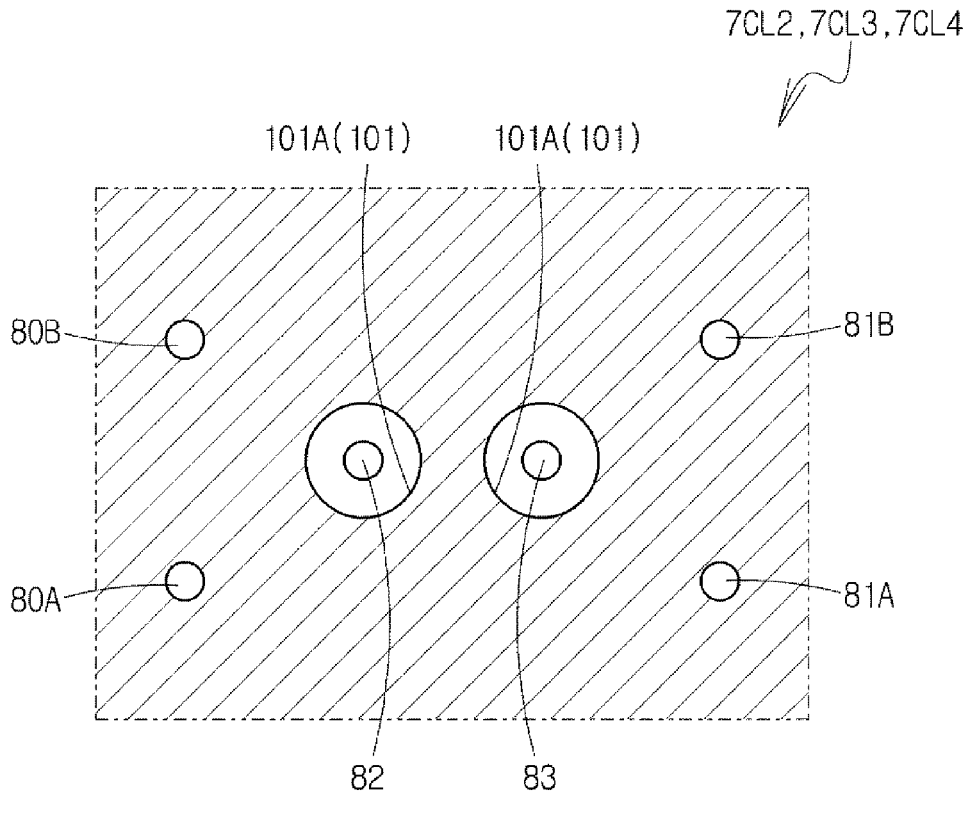
FIG. 29 is a partial bottom view of a second conductor layer to a fourth conductor layer of a mounting board (comparative example)

As shown in FIG. 29, the second conductor layer 7CL2 has two penetrating holes 101 in place of the penetrating hole 85 shown in FIG. 12. Each penetrating hole 101 has an inner edge 101A. In FIG. 29, the via hole 82 and the via hole 83 are respectively disposed inside the inner edges 101A of the two penetrating holes 101. The via hole 80A, the via hole 80B, the via hole 81A and the via hole 81B are disposed outside the inner edges 101A of the two penetrating holes 101. Each penetrating hole 101 is substantially circular. The third conductor layer 7CL3 and the fourth conductor layer 7CL4 have the same shape as the second conductor layer 7CL2.

(First Transmission Signal Integrity Analysis)

The transmission signal integrity in the differential transmission board set 4 according to the above-described first to fifth embodiments was analyzed, and the analysis results are described hereinafter with reference to FIGS. 30 to 32.

Ansys HFSS (registered trademark) manufactured by ANSYS, Inc. was used as analysis software. The thickness of each of the plurality of conductor layers 6CL and the plurality of conductor layers 7CL was 18 micrometers, the thickness of each of the first insulator layer 6SL1, the fifth insulator layer 6SL5, the first insulator layer 7SL1 and the fifth insulator layer 7SL5 was 100 micrometers, and the thickness of each of the second insulator layer 6SL2, the third insulator layer 6SL3, the fourth insulator layer 6SL4, the second insulator layer 7SL2, the third insulator layer 7SL3, and the fourth insulator layer 7SL4 was 200 micrometers. The pitch of the plurality of compression contacts 11 was 0.7 millimeters. Further, in FIG. 3, the first conductor layer 6CL1 and the first conductor layer 7CL1 were separated by 0.7 millimeters in the vertical direction. Each of the via hole 50A, the via hole 50B, the via hole 51A and the via hole 51B of the contact board 6 shown in FIGS. 5 to 8 had a diameter of 0.12 millimeters. Each of the via hole 80A, the via hole 80B, the via hole 81A and the via hole 81B of the mounting board 7 shown in FIGS. 12 to 15 had a diameter of 0.15 millimeters. The dielectric constant of the insulator layer 6SL and the insulator layer 7SL was 3.5.

Figure 30:
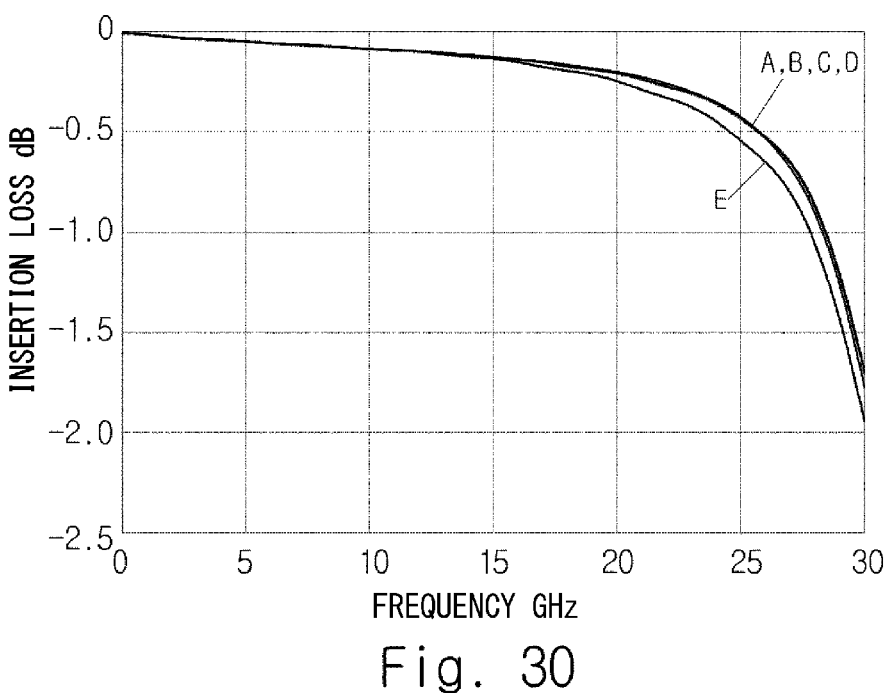
FIG. 30 is a graph showing analysis results of an insertion loss.

FIG. 30 is a graph showing analysis results of the insertion loss of differential transmission using the differential transmission board set 4. In the graph of FIG. 30, the horizontal axis indicates the frequency, and the vertical axis indicates the insertion loss. In FIG. 30, approximate curves A to E correspond to the first to fifth embodiments, respectively.

Figure 31:
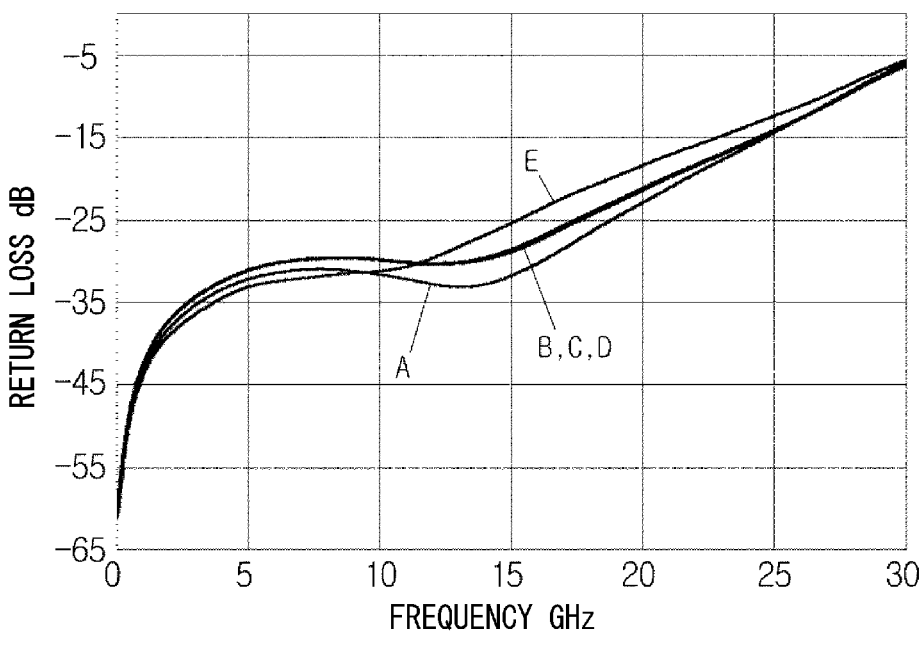
FIG. 31 is a graph showing analysis results of a return loss.

FIG. 31 is a graph showing analysis results of the return loss of differential transmission using the differential transmission board set 4. In the graph of FIG. 31, the horizontal axis indicates the frequency, and the vertical axis indicates the return loss. In FIG. 31, approximate curves A to E correspond to the first to fifth embodiments, respectively.

Figure 32:
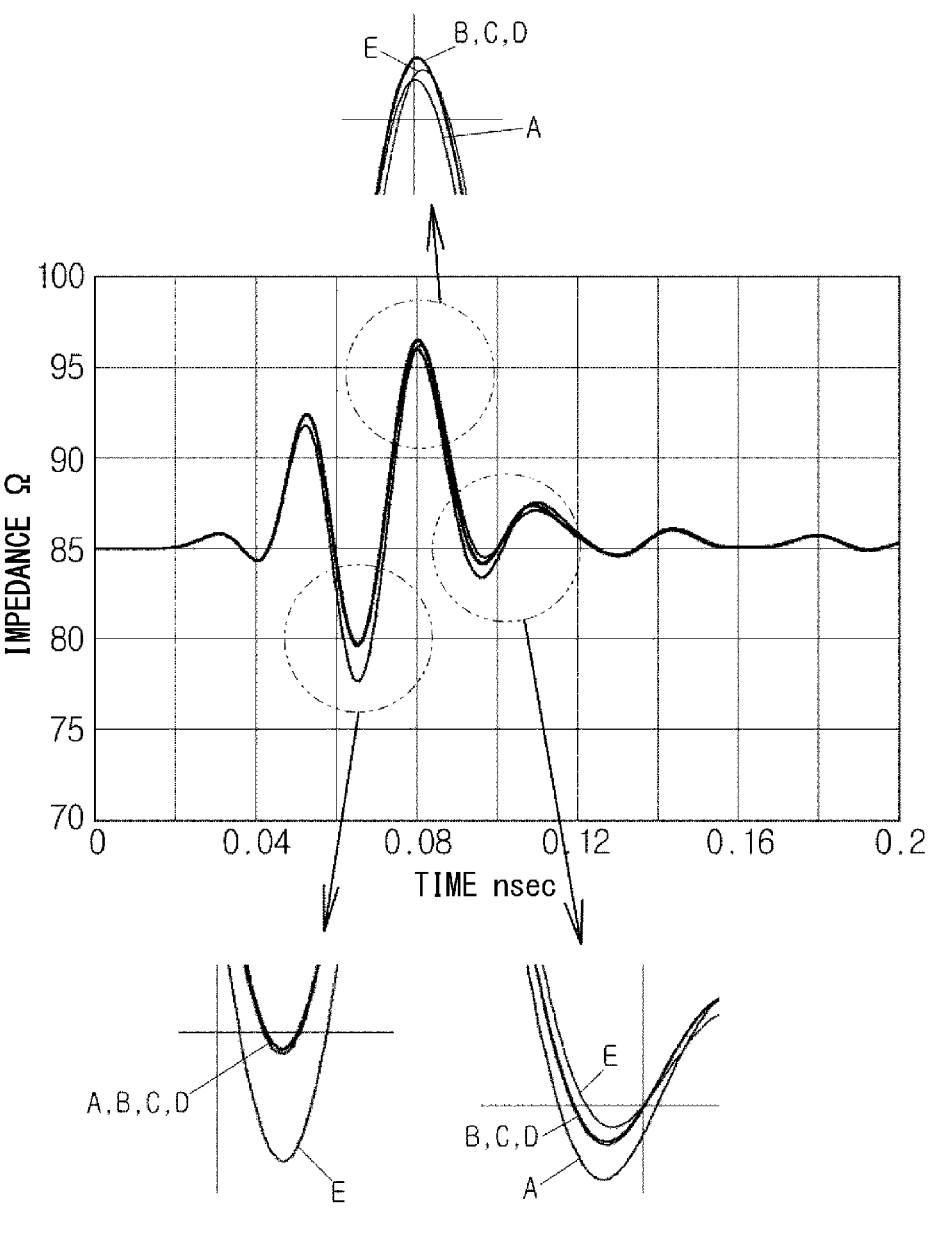
FIG. 32 is a graph showing analysis results of a differential impedance by the TDR method.

FIG. 32 is a graph showing analysis results of TDR (Time Domain Reflectometry) of differential transmission using the differential transmission board set 4. In the graph of FIG. 32, the horizontal axis indicates time, and the vertical axis indicates the differential impedance. In FIG. 32, approximate curves A to E correspond to the first to fifth embodiments, respectively. As shown in FIG. 32, in the TDR analysis, the differential transmission board set 4 is designed to have a differential impedance of 85Ω, for example. In FIG. 32, a differential impedance at 0.065 nsec in the horizontal axis indicates a differential impedance in the first signal pad 35 and the second signal pad 36 of the contact board 6, and a differential impedance at 0.095 nsec in the horizontal axis indicates a differential impedance in the first signal pad 65 and the second signal pad 66 of the mounting board 7.

FIG. 30 shows that excellent transmission characteristics are obtained in the differential transmission board set 4 according to the first to fifth embodiments. Particularly, in the first to fourth embodiments, the insertion loss is significantly lower than that in the fifth embodiment.

FIG. 31 shows that excellent transmission characteristics are obtained in the differential transmission board set 4 according to the first to fifth embodiments. Particularly, in the first to fourth embodiments, the return loss is significantly lower than that in the fifth embodiment. Further, in the first embodiment, the return loss is significantly lower than that in the second to fifth embodiments.

FIG. 32 shows that the differential impedance in the differential transmission board set 4 according to the first to fifth embodiments is within a narrow range of +/−13Ω of 85Ω, which is a design value.

In FIG. 32, referring to the differential impedance at 0.065 nsec in the horizontal axis, which is the differential impedance in the first signal pad 35 and the second signal pad 36 of the contact board 6, a decrease in differential impedance is controlled in the first to fourth embodiments compared with the fifth embodiment. This is possibly because the second conductor layer 6CL2, which is the inner edge 55A of the penetrating hole 55, is sufficiently away from the first signal pad 35 and the second signal pad 36 of the contact board 6 in the pitch direction in the first to fourth embodiments as shown in FIG. 10, for example. The result that the insertion loss in the first to fourth embodiments is lower than the insertion loss in the fifth embodiment in FIG. 30 is possibly because a decrease in the differential impedance in the first signal pad 35 and the second signal pad 36 of the contact board 6 was effectively controlled. Likewise, the result that the return loss in the first to fourth embodiments is lower than the return loss in the fifth embodiment in FIG. 31 is possibly because a decrease in the differential impedance in the first signal pad 35 and the second signal pad 36 of the contact board 6 was effectively controlled.

FIG. 32 shows that, referring to the differential impedance at 0.095 nsec in the horizontal axis, which is the differential impedance in the first signal pad 65 and the second signal pad 66 of the mounting board 7, the differential impedance is further reduced in the first embodiment compared with the second to fifth embodiments. This is possibly because the second conductor layer 7CL2, which is the penetrating hole 85, is narrow in the pitch direction in the first embodiment as shown in FIG. 17. However, a decrease in the differential impedance in the first signal pad 65 and the second signal pad 66 of the mounting board 7 does not cause any significant problem. This is because the amount of decrease in differential impedance in the first signal pad 65 and the second signal pad 66 of the mounting board 7 is about one-fifth of that in the first signal pad 35 and the second signal pad 36 of the contact board 6.

In FIG. 32, referring to the differential impedance at 0.08 nsec in the horizontal axis, which is the differential impedance in the compression contact 11, the amount of increase in differential impedance is reduced in the first embodiment compared with the second to fifth embodiments. This is possibly because the differential impedance at 0.095 nsec in the horizontal axis, which is the differential impedance in the first signal pad 65 and the second signal pad 66 of the mounting board 7, is further reduced in the first embodiment compared with the second to fifth embodiments as described above. Then, as shown in FIG. 31, the result that the return loss in the first embodiment is particularly lower than that in the second to fifth embodiments is possibly because the amount of increase in differential impedance in the compression contact 11 is reduced in the first embodiment as shown in FIG. 32. Specifically, in the first embodiment, the return loss is reduced by intentionally diminishing the effect of reducing the amount of decrease in differential impedance in the first signal pad 65 and the second signal pad 66 of the mounting board 7.

(Second Transmission Signal Integrity Analysis)

The transmission signal integrity in the differential transmission board set 4 in examples where the first modified example is applied to the first to fifth embodiments and the differential transmission board set 4 in the comparative example was analyzed, and the analysis results are described hereinafter with reference to FIGS. 33 to 35. Note that an example where the first modified example is applied to the first embodiment is the first modified example.

Ansys HFSS (registered trademark) manufactured by ANSYS, Inc. was used as analysis software. The thickness of each of the plurality of conductor layers 6CL and the plurality of conductor layers 7CL was 18 micrometers, the thickness of each of the first insulator layer 6SL1, the fifth insulator layer 6SL5, the first insulator layer 7SL1 and the fifth insulator layer 7SL5 was 100 micrometers, and the thickness of each of the second insulator layer 6SL2, the third insulator layer 6SL3, the fourth insulator layer 6SL4, the second insulator layer 7SL2, the third insulator layer 7SL3, and the fourth insulator layer 7SL4 was 200 micrometers. The pitch of the plurality of compression contacts 11 was 0.7 millimeters. Further, in FIG. 3, the first conductor layer 6CL1 and the first conductor layer 7CL1 were separated by 0.7 millimeters in the vertical direction. Each of the via hole 50A, the via hole 50B, the via hole 51A and the via hole 51B of the contact board 6 shown in FIGS. 5 to 8 had a diameter of 0.12 millimeters. Each of the via hole 80A, the via hole 80B, the via hole 81A and the via hole 81B of the mounting board 7 shown in FIGS. 12 to 15 had a diameter of 0.15 millimeters. The dielectric constant of the insulator layer 6SL and the insulator layer 7SL was 3.5.

Figure 33:
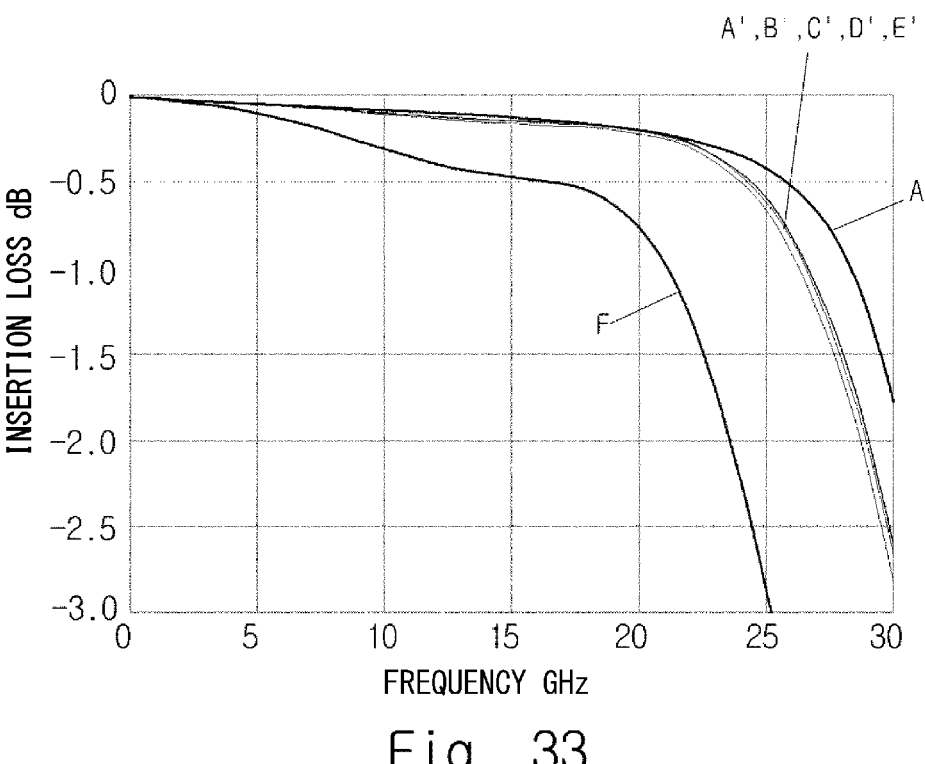
FIG. 33 is a graph showing analysis results of an insertion loss.

FIG. 33 is a graph showing analysis results of the insertion loss of differential transmission using the differential transmission board set 4. In the graph of FIG. 33, the horizontal axis indicates the frequency, and the vertical axis indicates the insertion loss. In FIG. 33, an approximate curve A corresponds to the first embodiment, approximate curves A' to E' correspond to examples where the first modified example is applied to the first to fifth embodiments, respectively, and an approximate curve F corresponds to the comparative example.

Figure 34:
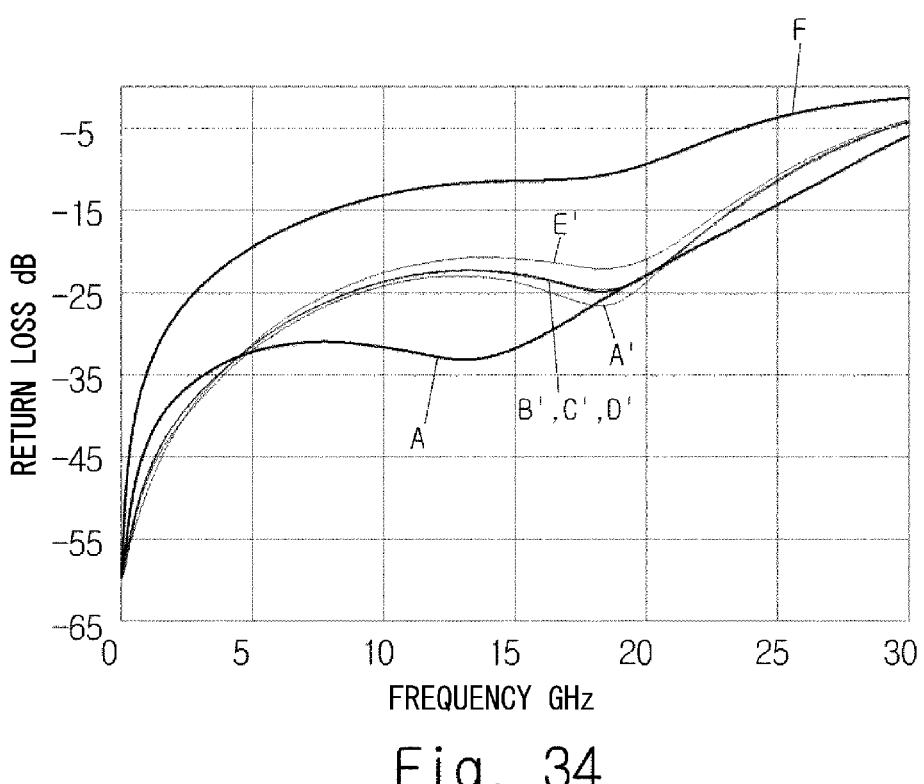
FIG. 34 is a graph showing analysis results of a return loss.

FIG. 34 is a graph showing analysis results of the return loss of differential transmission using the differential transmission board set 4. In the graph of FIG. 34, the horizontal axis indicates the frequency, and the vertical axis indicates the return loss. In FIG. 34, an approximate curve A corresponds to the first embodiment, approximate curves A' to E' correspond to examples where the first modified example is applied to the first to fifth embodiments, respectively, and an approximate curve F corresponds to the comparative example.

Figure 35:
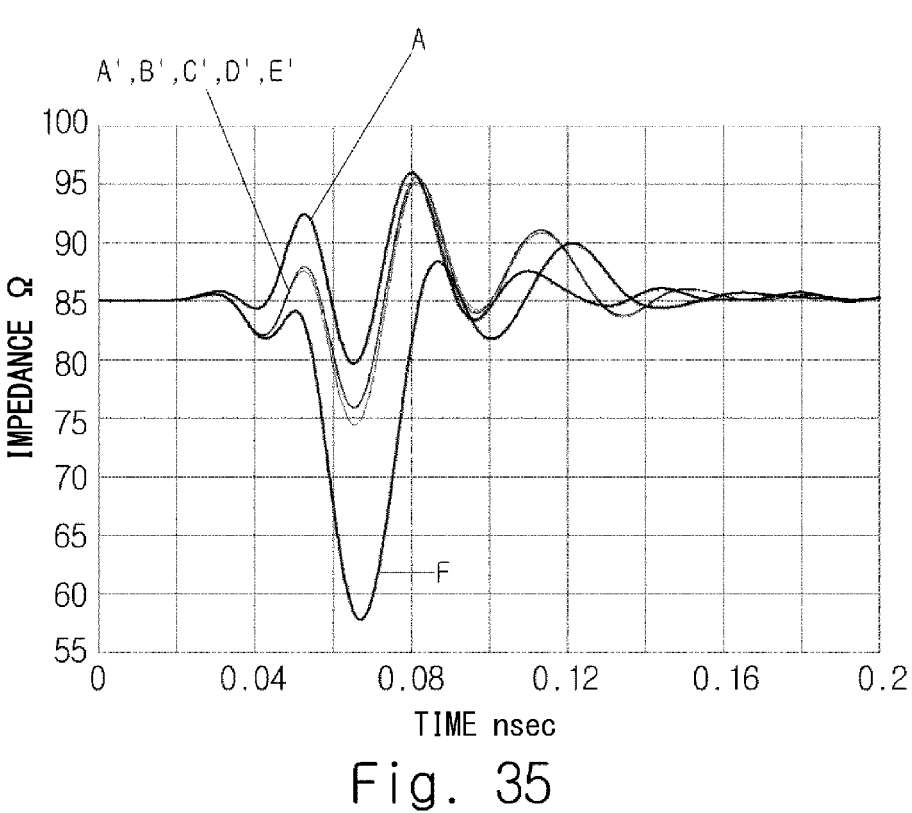
FIG. 35 is a graph showing analysis results of a differential impedance by the TDR method.
Figure 36:
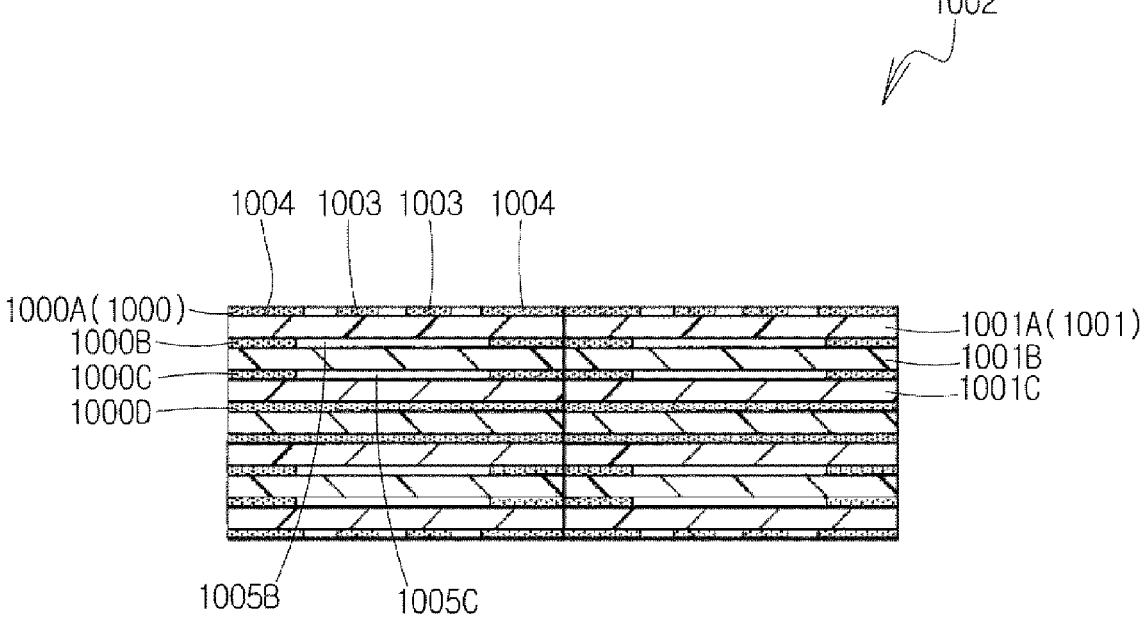
FIG. 36 is a simplified view of FIG. 16 of Patent Literature 1.

FIG. 35 is a graph showing analysis results of TDR (Time Domain Reflectometry) of differential transmission using the differential transmission board set 4. In the graph of FIG. 35, the horizontal axis indicates time, and the vertical axis indicates the differential impedance. In FIG. 35, an approximate curve A corresponds to the first embodiment, approximate curves A' to E' correspond to examples where the first modified example is applied to the first to fifth embodiments, respectively, and an approximate curve F corresponds to the comparative example. As shown in FIG. 35, in the TDR analysis, the differential transmission board set 4 is designed to have a differential impedance of 85Ω, for example. In FIG. 35, a differential impedance at 0.065 nsec in the horizontal axis indicates a differential impedance in the first signal pad 35 and the second signal pad 36 of the contact board 6, and a differential impedance at 0.095 nsec in the horizontal axis indicates a differential impedance in the first signal pad 65 and the second signal pad 66 of the mounting board 7.

FIG. 33 shows that, when the first modified example is applied to the first to fifth embodiments, although the insertion loss slightly increases, it is still significantly lower than the insertion loss in the comparative example.

FIG. 34 shows that, when the first modified example is applied to the first to fifth embodiments, although the return loss slightly increases, it is still significantly lower than the return loss in the comparative example.

FIG. 35 shows that, when the first modified example is applied to the first to fifth embodiments, although the amount of decrease in differential impedance in the first signal pad 35 and the second signal pad 36 of the contact board 6 slightly increases, it is still significantly smaller than the amount of decrease in the comparative example.

A plurality of preferred embodiments of the present disclosure are described above.

The first to fifth embodiments described above have the following common features.

Specifically, as shown in FIGS. 1 to 3, the differential transmission board set 4 includes the mounting board 7 on which the compression connector 5 is mounted and the contact board 6 configured to come into contact with the compression connector 5. The contact board 6 and the mounting board 7 are electrically connected to each other through the compression connector 5. The compression connector 5 includes the four compression contacts 11 arranged in a row, each including the soldering part 20 and the spring part 21, and the housing 12 that holds the four compression contacts 11. As shown in FIG. 3, the mounting board 7 is a multilayer board in which the plurality of conductor layers 7CL and the plurality of insulator layers 7SL are laminated alternately. The contact board 6 is a multilayer board in which the plurality of conductor layers 6CL and the plurality of insulator layers 6SL are laminated alternately.

In the mounting board 7, the plurality of conductor layers 7CL include the first conductor layer 7CL1 and the second conductor layer 7CL2 in this recited order from the compression connector 5 side. In the contact board 6, the plurality of conductor layers 6CL include the first conductor layer 6CL1 and the second conductor layer 6CL2 in this recited order from the compression connector 5 side.

As shown in FIG. 11, in the mounting board 7, the first conductor layer 7CL1 includes the four electrode pads 60 corresponding to the four compression contacts 11. The four electrode pads 60 include the first signal pad 65, the second signal pad 66, the first ground pad 63 and the second ground pad 64. The first ground pad 63, the first signal pad 65, the second signal pad 66 and the second ground pad 64 are arranged in this recited order in the pitch direction (first direction). The soldering parts 20 of the four compression contacts 11 are able to be soldered to the first ground pad 63, the first signal pad 65, the second signal pad 66 and the second ground pad 64, respectively.

As shown in FIG. 4, in the contact board 6, the first conductor layer 6CL1 includes the four electrode pads 30 corresponding to the four compression contacts 11. The four electrode pads 30 include the first signal pad 35, the second signal pad 36, the first ground pad 33 and the second ground pad 34. The first ground pad 33, the first signal pad 35, the second signal pad 36 and the second ground pad 34 are arranged in this recited order in the pitch direction (first direction). The spring parts 21 of the four compression contacts 11 are able to come into contact with the first ground pad 33, the first signal pad 35, the second signal pad 36 and the second ground pad 34, respectively.

As shown in FIG. 12, in the mounting board 7, the second conductor layer 7CL2 is a ground layer and has the penetrating hole 85. As shown in FIG. 17, in the mounting board 7, the penetrating hole 85 is formed in such a way that the first signal pad 65 and the second signal pad 66 are both located inside the inner edge 85A of the penetrating hole 85 when viewed in the vertical direction (in the laminating direction). As shown in FIG. 11, in the mounting board 7, the first ground pad 63 includes the inner region 63P that is closer to the first signal pad 65 relative to the dividing line 63R that divides the pad area of the first ground pad 63 in half in the pitch direction, and the outer region 63Q that is farther from the first signal pad 65 relative to the dividing line 63R. In the mounting board 7, the second ground pad 64 includes the inner region 64P that is closer to the second signal pad 66 relative to the dividing line 64R that divides the pad area of the second ground pad 64 in half in the pitch direction, and the outer region 64Q that is farther from the second signal pad 66 relative to the dividing line 64R.

As shown in FIG. 5, in the contact board 6, the second conductor layer 6CL2 is a ground layer and has the penetrating hole 55. As shown in FIG. 10, in the contact board 6, the penetrating hole 55 is formed in such a way that the first signal pad 35 and the second signal pad 36 are both located inside the inner edge 55A of the penetrating hole 55 when viewed in the vertical direction (in the laminating direction). As shown in FIG. 4, in the contact board 6, the first ground pad 33 includes the inner region 33P that is closer to the first signal pad 35 relative to the dividing line 33R that divides the pad area of the first ground pad 33 in half in the pitch direction, and the outer region 33Q that is farther from the first signal pad 35 relative to the dividing line 33R. In the contact board 6, the second ground pad 34 includes the inner region 34P that is closer to the second signal pad 36 relative to the dividing line 34R that divides the pad area of the second ground pad 34 in half in the pitch direction, and the outer region 34Q that is farther from the second signal pad 36 relative to the dividing line 34R.

In at least one of the mounting board 7 and the contact board 6, the penetrating hole 85 (or the penetrating hole 55) is formed to overlap the outer region 63Q (or the outer region 33Q) of the first ground pad 63 (or the first ground pad 33) and the outer region 64Q (or the outer region 34Q) of the second ground pad 64 (or the second ground pad 34) when viewed in the vertical direction.

In this structure, as shown in FIGS. 30 and 31, the differential transmission board set 4 having excellent transmission characteristics is achieved.

The first embodiment and the third to fifth embodiments described above have the following common features.

As shown in FIGS. 22 to 27, in only one of the mounting board 7 and the contact board 6, the penetrating hole 85 (or the penetrating hole 55) is formed to overlap the outer region 63Q (or the outer region 33Q) of the first ground pad 63 (or the first ground pad 33) and the outer region 64Q (or the outer region 34Q) of the second ground pad 64 (or the second ground pad 34) when viewed in the vertical direction. Thus, in the other one, the penetrating hole 85 (or the penetrating hole 55) is formed in a compact manner so as not to overlap the outer region 63Q (or the outer region 33Q) of the first ground pad 63 (or the first ground pad 33) and the outer region 64Q (or the outer region 34Q) of the second ground pad 64 (or the second ground pad 34) when viewed in the vertical direction.

In this structure, as shown in FIGS. 30 and 31, the differential transmission board set 4 having excellent transmission characteristics is achieved. Further, the electromagnetic shield effect in the other one is expected to be achieved.

The first modified example described above has the following feature.

As shown in FIG. 19, in the mounting board 7, the third conductor layer 7CL3 is a ground layer and overlaps the first signal pad 65 and the second signal pad 66 in the vertical direction. Further, as shown in FIG. 18, in the contact board 6, the third conductor layer 6CL3 is a ground layer and overlaps the first signal pad 35 and the second signal pad 36 in the vertical direction.

In this structure also, as shown in FIGS. 33 and 34, the differential transmission board set 4 having excellent transmission characteristics is achieved. Further, the electromagnetic shield effect in the third conductor layer 7CL3 and the third conductor layer 6CL3 is expected to be achieved.

The first to fifth embodiments described above have the following common features.

Specifically, as shown in FIGS. 13 and 14, in the mounting board 7, the third conductor layer 7CL3 and the fourth conductor layer 7CL4 are ground layers and have the penetrating hole 86 and the penetrating hole 87, respectively. As shown in FIG. 17, in the mounting board 7, the penetrating hole 86 of the third conductor layer 7CL3 is formed in such a way that the first signal pad 65 and the second signal pad 66 are both located inside the inner edge 86A of the penetrating hole 86 when viewed in the vertical direction. Likewise, the penetrating hole 87 of the fourth conductor layer 7CL4 is formed in such a way that the first signal pad 65 and the second signal pad 66 are both located inside the inner edge 87A of the penetrating hole 87 when viewed in the vertical direction. As shown in FIG. 15, in the mounting board 7, the fifth conductor layer 7CL5 is a ground layer and overlaps the first signal pad 65 and the second signal pad 66 in the vertical direction (see FIG. 19 for better understanding).

Further, as shown in FIGS. 6 and 7, in the contact board 6, the third conductor layer 6CL3 and the fourth conductor layer 6CL4 are ground layers and have the penetrating hole 56 and the penetrating hole 57, respectively. As shown in FIG. 10, in the contact board 6, the penetrating hole 56 of the third conductor layer 6CL3 is formed in such a way that the first signal pad 35 and the second signal pad 36 are both located inside the inner edge 56A of the penetrating hole 56 when viewed in the vertical direction. Likewise, the penetrating hole 57 of the fourth conductor layer 6CL4 is formed in such a way that the first signal pad 35 and the second signal pad 36 are both located inside the inner edge 57A of the penetrating hole 57 when viewed in the vertical direction. As shown in FIG. 8, in the contact board 6, the fifth conductor layer 6CL5 is a ground layer and overlaps the first signal pad 35 and the second signal pad 36 in the vertical direction (see FIG. 18 for better understanding).

In this structure, as shown in FIGS. 30 and 31, the differential transmission board set 4 having excellent transmission characteristics is achieved.

Further, as shown in FIG. 2, the compression connector 5 includes a plurality of compression contact groups 11G, each including the four compression contacts 11 arranged in a row.

Further, the plurality of conductor layers 6CL of the contact board 6 include the first conductor layer 6CL1, the second conductor layer 6CL2, . . . , the (N−1)th conductor layer, and the Nth conductor layer in this recited order from the compression connector 5 side. N is a natural number of 4 or more. In each of the above-described embodiments, the (N−1)th conductor layer and the Nth conductor layer correspond to the fifth conductor layer 6CL5 and the sixth conductor layer 6CL6, respectively. The sixth conductor layer 6CL6 (the Nth conductor layer) includes the first signal pad 45 and the second signal pad 46 that are electrically connected to the first signal pad 35 and the second signal pad 36 of the first conductor layer 6CL1, respectively. As shown in FIGS. 8 and 9, the fifth conductor layer 6CL5 (the (N−1)th conductor layer) is a ground layer and overlaps the first signal pad 45 and the second signal pad 46 of the sixth conductor layer 6CL6 in the laminating direction. In this structure, the electromagnetic shield effect of the first signal pad 45 and the second signal pad 46 of the sixth conductor layer 6CL6 (the Nth conductor layer) is sufficiently large.

Likewise, the plurality of conductor layers 7CL of the mounting board 7 include the first conductor layer 7CL1, the second conductor layer 7CL2, . . . , the (N−1)th conductor layer, and the Nth conductor layer in this recited order from the compression connector 5 side. N is a natural number of 4 or more. In each of the above-described embodiments, the (N−1)th conductor layer and the Nth conductor layer correspond to the fifth conductor layer 7CL5 and the sixth conductor layer 7CL6, respectively. The sixth conductor layer 7CL6 (the Nth conductor layer) includes the first signal pad 75 and the second signal pad 76 that are electrically connected to the first signal pad 65 and the second signal pad 66 of the first conductor layer 7CL1, respectively. As shown in FIGS. 15 and 16, the fifth conductor layer 7CL5 (the (N−1)th conductor layer) is a ground layer and overlaps the first signal pad 75 and the second signal pad 76 of the sixth conductor layer 7CL6 in the laminating direction. In this structure, the electromagnetic shield effect of the first signal pad 75 and the second signal pad 76 of the sixth conductor layer 7CL6 (the Nth conductor layer) is sufficiently large.

Note that both of the contact board 6 and the mounting board 7 may have the feature of the (N−1)th conductor layer described above, and only one of the contact board 6 and the mounting board 7 may have the feature of the (N−1)th conductor layer described above.

Each of the above-described embodiments may be modified as follows, for example.

Specifically, in FIG. 5, any one of the via hole 50A and the via hole 50B may be omitted. In FIG. 5, any one of the via hole 51A and the via hole 51B may be omitted. In FIG. 12, any one of the via hole 80A and the via hole 80B may be omitted. In FIG. 12, any one of the via hole 81A and the via hole 81B may be omitted.

Further, as shown in FIG. 3, in each of the above-described embodiments, the contact board 6 includes the first to sixth conductor layers as the plurality of conductor layers 6CL. Alternatively, the contact board 6 may further include the seventh and eighth conductor layers as the plurality of conductor layers 6CL. The sixth conductor layer 6CL6, the seventh conductor layer and the eighth conductor layer are arranged sequentially from the compression connector 5 side. In this case, the seventh and eighth conductor layers are typically ground layers. The seventh and eighth conductor layers may have any thickness and shape. The same applies to the mounting board 7.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A differential transmission board set being a combination of two differential transmission boards electrically connected to each other through a compression connector including four compression contacts arranged in a row, each compression contact including a soldering part and a spring part, and a housing holding the four compression contacts, wherein the two differential transmission boards include a mounting board on which the compression connector is mounted and a contact board configured to come into contact with the compression connector, each of the mounting board and the contact board is a multilayer board having a plurality of conductor layers and a plurality of insulator layers laminated alternately, in each of the mounting board and the contact board, the plurality of conductor layers include a first conductor layer and a second conductor layer sequentially in this recited order from the compression connector side, in each of the mounting board and the contact board, the first conductor layer includes four electrode pads corresponding to the four compression contacts, the four electrode pads include a first signal pad, a second signal pad, a first ground pad, and a second ground pad, the first ground pad, the first signal pad, the second signal pad, and the second ground pad are arranged in this recited order along a first direction, in the mounting board, the soldering parts of the four compression contacts are able to be soldered to the first ground pad, the first signal pad, the second signal pad, and the second ground pad, respectively, in the contact board, the spring parts of the four compression contacts are able to come into contact with the first ground pad, the first signal pad, the second signal pad, and the second ground pad, respectively, in each of the mounting board and the contact board, the second conductor layer is a ground layer and has a penetrating hole, in each of the mounting board and the contact board, the penetrating hole is formed in such a way that the first signal pad and the second signal pad are both located inside an inner edge of the penetrating hole when viewed in a laminating direction, in each of the mounting board and the contact board, the first ground pad includes an inner region closer to the first signal pad relative to a dividing line that divides a pad area of the first ground pad in half in the first direction, and an outer region farther from the first signal pad relative to the dividing line, in each of the mounting board and the contact board, the second ground pad includes an inner region closer to the second signal pad relative to a dividing line that divides a pad area of the second ground pad in half in the first direction, and an outer region farther from the second signal pad relative to the dividing line, and in at least one of the mounting board and the contact board, the penetrating hole is formed to overlap the outer region of the first ground pad and the outer region of the second ground pad when viewed along the laminating direction.

2. The differential transmission board set according to claim 1, wherein in only one of the mounting board and the contact board, the penetrating hole is formed to overlap the outer region of the first ground pad and the outer region of the second ground pad when viewed along the laminating direction.

3. The differential transmission board set according to claim 1, wherein in each of the mounting board and the contact board, the plurality of conductor layers further include a third conductor layer, and the first conductor layer, the second conductor layer and the third conductor layer are laminated sequentially in this recited order from the compression connector side, and in each of the mounting board and the contact board, the third conductor layer is a ground layer and overlaps the first signal pad and the second signal pad in the laminating direction.

4. The differential transmission board set according to claim 1, wherein in each of the mounting board and the contact board, the plurality of conductor layers further include a third conductor layer, a fourth conductor layer, and a fifth conductor layer, and the first conductor layer, the second conductor layer, the third conductor layer, the fourth conductor layer, and the fifth conductor layer are laminated sequentially in this recited order from the compression connector side, in each of the mounting board and the contact board, the third conductor layer and the fourth conductor layer are ground layers and have a penetrating hole, in each of the mounting board and the contact board, the penetrating hole of each of the third conductor layer and the fourth conductor layer is formed in such a way that the first signal pad and the second signal pad are both located inside an inner edge of the penetrating hole when viewed along the laminating direction, and in each of the mounting board and the contact board, the fifth conductor layer is a ground layer and overlaps the first signal pad and the second signal pad in the laminating direction.

5. The differential transmission board set according to claim 1, wherein the differential transmission board set is a combination of two differential transmission boards electrically connected to each other through a compression connector having a plurality of compression contact groups, each group including the four compression contacts arranged in a row.

6. The differential transmission board set according to claim 1, wherein in at least one of the mounting board and the contact board, the plurality of conductor layers include the first conductor layer, the second conductor layer, . . . , an (N−1) th conductor layer, and an Nth conductor layer (N is a natural number of 4 or more) sequentially in this recited order from the compression connector side, the Nth conductor layer includes a first signal pad and a second signal pad electrically connected to the first signal pad and the second signal pad of the first conductor layer, respectively, and the (N−1)th conductor layer is a ground layer and overlaps the first signal pad and the second signal pad of the Nth conductor layer in the laminating direction.

7. An assembly comprising:

the differential transmission board set according to claim 1; and the compression connector.

* * * * *